(12) United States Patent
Tanaka

(10) Patent No.: US 8,395,084 B2
(45) Date of Patent: Mar. 12, 2013

(54) LASER IRRADIATION APPARATUS AND LASER IRRADIATION METHOD

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 211 days.

(21) Appl. No.: 11/919,748

(22) PCT Filed: Apr. 26, 2006

(86) PCT No.: PCT/JP2006/309191
§ 371 (c)(1),
(2), (4) Date: Nov. 1, 2007

(87) PCT Pub. No.: WO2006/118312
PCT Pub. Date: Nov. 9, 2006

(65) Prior Publication Data
US 2009/0127477 A1    May 21, 2009

(30) Foreign Application Priority Data
May 2, 2005 (JP) .................................. 2005-133788

(51) Int. Cl.
*B23K 26/06* (2006.01)
*B23K 26/00* (2006.01)

(52) U.S. Cl. ................................. 219/121.73; 219/121.6

(58) Field of Classification Search ... 219/121.6–121.86
See application file for complete search history.

(56) References Cited

U.S. PATENT DOCUMENTS

| 4,420,233 | A | | 12/1983 | Nomoto et al. |
| 4,743,932 | A | | 5/1988 | Matsui |
| 4,941,093 | A | * | 7/1990 | Marshall et al. ................. 606/5 |
| 4,990,763 | A | | 2/1991 | Shinada |
| 5,728,215 | A | | 3/1998 | Itagaki et al. |
| 5,760,366 | A | * | 6/1998 | Haruta et al. ............ 219/121.68 |

(Continued)

FOREIGN PATENT DOCUMENTS

| EP | 1 055 479 | 11/2000 |
| EP | 1724048 A2 | 11/2006 |

(Continued)

OTHER PUBLICATIONS

International Search Report (Application No. PCT/JP2006/309191) dated Jul. 25, 2006.

(Continued)

*Primary Examiner* — Sang Paik
(74) *Attorney, Agent, or Firm* — Eric J. Robinson; Robinson Intellectual Property Law Office, P.C.

(57) ABSTRACT

A laser beam having homogeneous intensity distribution is delivered without causing interference stripes of a laser to appear on an irradiation surface. A laser beam emitted from a laser oscillator passes through a diffractive optical element so that the intensity distribution thereof is homogenized. The beam emitted from the diffractive optical element then passes through a slit so that low-intensity end portions in a major-axis direction of the beam are blocked. Subsequently, the beam passes through a projecting lens and a condensing lens, so that an image of the slit is projected onto the irradiation surface. The projecting lens is provided so that the slit and the irradiation surface are conjugated. Thus, the irradiation surface can be irradiated with the laser having homogeneous intensity while preventing the diffraction by the slit.

22 Claims, 26 Drawing Sheets

U.S. PATENT DOCUMENTS

| | | | | |
|---|---|---|---|---|
| 5,864,430 | A * | 1/1999 | Dickey et al. | 359/559 |
| 6,172,820 | B1 * | 1/2001 | Kuwahara | 359/719 |
| 6,246,524 | B1 | 6/2001 | Tanaka | |
| 6,353,218 | B1 | 3/2002 | Yamazaki et al. | |
| 6,393,042 | B1 * | 5/2002 | Tanaka | 372/101 |
| 6,437,313 | B2 | 8/2002 | Yamazaki et al. | |
| 6,563,567 | B1 | 5/2003 | Komatsuda et al. | |
| 6,635,850 | B2 * | 10/2003 | Amako et al. | 219/121.76 |
| 6,676,878 | B2 | 1/2004 | O'Brien et al. | |
| 6,750,424 | B2 | 6/2004 | Tanaka | |
| 6,753,212 | B2 | 6/2004 | Yamazaki et al. | |
| 6,787,755 | B2 | 9/2004 | Yamazaki et al. | |
| 6,791,060 | B2 * | 9/2004 | Dunsky et al. | 219/121.7 |
| 6,818,568 | B2 | 11/2004 | Tanaka | |
| 6,852,947 | B2 | 2/2005 | Tanaka | |
| 6,870,125 | B2 | 3/2005 | Doi et al. | |
| 6,885,432 | B2 | 4/2005 | Tsuji | |
| 6,891,175 | B2 | 5/2005 | Hiura | |
| 6,908,835 | B2 | 6/2005 | Sposili et al. | |
| 6,911,659 | B1 | 6/2005 | Malo | |
| 6,943,086 | B2 | 9/2005 | Hongo et al. | |
| 6,949,452 | B2 | 9/2005 | Hatano et al. | |
| 6,961,361 | B1 | 11/2005 | Tanaka | |
| 6,977,775 | B2 | 12/2005 | Sasaki et al. | |
| 6,989,524 | B2 | 1/2006 | Yamazaki et al. | |
| 7,078,322 | B2 | 7/2006 | Tanada et al. | |
| 7,105,048 | B2 | 9/2006 | Yamazaki et al. | |
| 7,115,457 | B2 | 10/2006 | Sasaki et al. | |
| 7,138,306 | B2 | 11/2006 | Tanaka et al. | |
| 7,183,148 | B2 | 2/2007 | Yazaki et al. | |
| 7,192,852 | B2 | 3/2007 | Hatano et al. | |
| 7,223,644 | B2 | 5/2007 | Inoue et al. | |
| 7,230,316 | B2 | 6/2007 | Yamazaki et al. | |
| 7,252,910 | B2 | 8/2007 | Hasegawa et al. | |
| 7,253,120 | B2 | 8/2007 | Glazer et al. | |
| 7,259,081 | B2 | 8/2007 | Im | |
| 7,294,589 | B2 | 11/2007 | Tanaka | |
| 7,326,623 | B2 | 2/2008 | Hongo et al. | |
| 7,402,772 | B2 | 7/2008 | Hamada et al. | |
| 7,408,144 | B2 | 8/2008 | Yamazaki et al. | |
| 7,410,508 | B2 | 8/2008 | Sasaki et al. | |
| 7,468,312 | B2 | 12/2008 | Tanaka | |
| 7,517,773 | B2 | 4/2009 | Tanada et al. | |
| 7,521,326 | B2 | 4/2009 | Tanaka | |
| 7,528,023 | B2 | 5/2009 | Sasaki et al. | |
| 7,541,230 | B2 | 6/2009 | Sasaki et al. | |
| 7,660,042 | B2 | 2/2010 | Sasaki et al. | |
| 7,666,769 | B2 | 2/2010 | Hatano et al. | |
| 7,772,523 | B2 | 8/2010 | Tanaka et al. | |
| 7,812,283 | B2 | 10/2010 | Tanaka et al. | |
| 7,834,353 | B2 | 11/2010 | Hongo et al. | |
| 7,927,935 | B2 | 4/2011 | Sasaki et al. | |
| 7,943,885 | B2 | 5/2011 | Tanaka et al. | |
| 8,026,152 | B2 | 9/2011 | Yamazaki et al. | |
| 2001/0046088 | A1 | 11/2001 | Sano et al. | |
| 2002/0047847 | A1 | 4/2002 | Tamura | |
| 2002/0134765 | A1 * | 9/2002 | Tanaka et al. | 219/121.6 |
| 2002/0151121 | A1 | 10/2002 | Tanaka | |
| 2002/0166845 | A1 * | 11/2002 | Cordingley et al. | 219/121.62 |
| 2003/0068836 | A1 | 4/2003 | Hongo et al. | |
| 2003/0086182 | A1 | 5/2003 | Tanaka et al. | |
| 2003/0103176 | A1 | 6/2003 | Abe et al. | |
| 2003/0112322 | A1 | 6/2003 | Tanaka | |
| 2003/0150843 | A1 | 8/2003 | Doi et al. | |
| 2003/0153182 | A1 | 8/2003 | Yamazaki et al. | |
| 2003/0216012 | A1 | 11/2003 | Sasaki et al. | |
| 2004/0041158 | A1 | 3/2004 | Hongo et al. | |
| 2004/0164306 | A1 | 8/2004 | Hongo et al. | |
| 2004/0195222 | A1 | 10/2004 | Tanaka et al. | |
| 2004/0222197 | A1 * | 11/2004 | Hiramatsu | 219/121.7 |
| 2004/0228004 | A1 | 11/2004 | Sercel et al. | |
| 2004/0266223 | A1 | 12/2004 | Tanaka et al. | |
| 2005/0115937 | A1 * | 6/2005 | Gu et al. | 219/121.69 |
| 2005/0227504 | A1 | 10/2005 | Sasaki et al. | |
| 2005/0247684 | A1 | 11/2005 | Tanaka | |
| 2005/0282408 | A1 | 12/2005 | Sasaki et al. | |
| 2006/0215722 | A1 | 9/2006 | Tanaka et al. | |
| 2007/0000428 | A1 | 1/2007 | Yamazaki et al. | |
| 2007/0077696 | A1 | 4/2007 | Tanaka et al. | |
| 2007/0131962 | A1 | 6/2007 | Yazaki et al. | |
| 2007/0148834 | A1 | 6/2007 | Tanaka et al. | |
| 2007/0158315 | A1 | 7/2007 | Tanaka et al. | |
| 2009/0173893 | A1 | 7/2009 | Tanaka et al. | |
| 2012/0007159 | A1 | 1/2012 | Yamazaki et al. | |

FOREIGN PATENT DOCUMENTS

| | | |
|---|---|---|
| JP | 2000-058478 A | 2/2000 |
| JP | 2000-066133 A | 3/2000 |
| JP | 2000-091264 A | 3/2000 |
| JP | 2000-323428 A | 11/2000 |
| JP | 2001-068430 A | 3/2001 |
| JP | 2003-124136 A | 4/2003 |
| JP | 2003-257885 A | 9/2003 |
| JP | 2004-103628 A | 4/2004 |
| JP | 2004-179356 A | 6/2004 |
| JP | 2004-179474 A | 6/2004 |
| JP | 2004-193201 A | 7/2004 |
| JP | 2005-099427 A | 4/2005 |
| JP | 2005-101654 A | 4/2005 |
| JP | 2005-347741 | 12/2005 |
| JP | 2006-093677 | 4/2006 |
| JP | 2006-186349 | 7/2006 |

OTHER PUBLICATIONS

Written Opinion (Application No. PCT/JP2006/309191) dated Jul. 25, 2006.

US 6,414,981, 07/2002, Tanaka (withdrawn).

* cited by examiner (x) threshold at which crystalline region is formed
(y) threshold at which large crystalline region is formed $1/f = 1/d_1 + 1/d_2$
$d_1 : d_2 = a : b$ FIG.7 (a1)
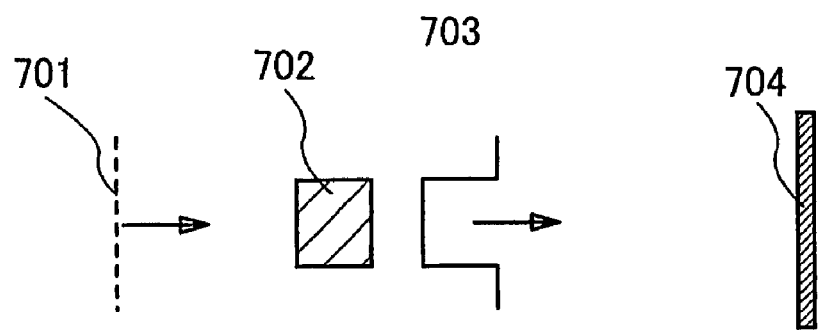
FIG.7 (a2)
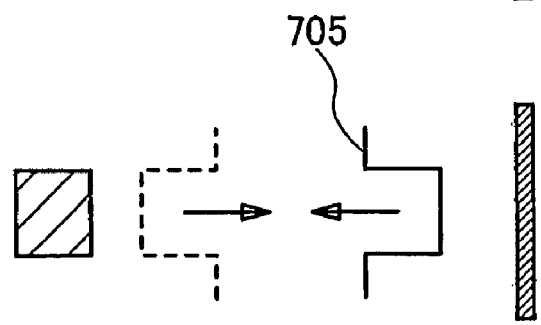
FIG.7 (a3)
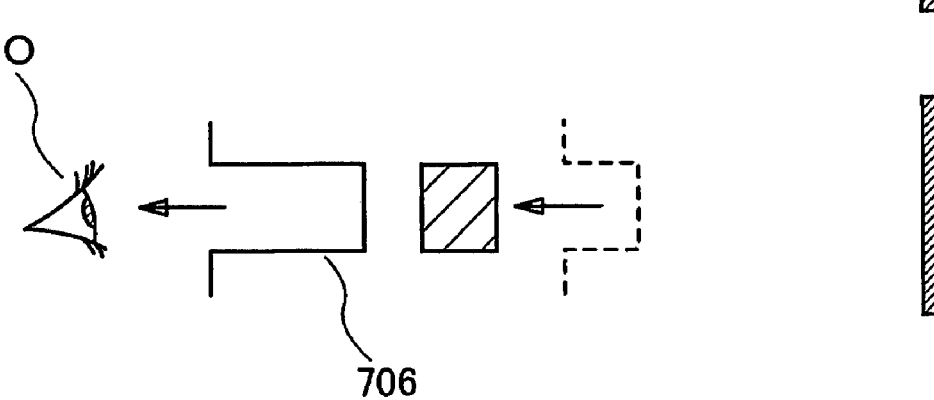

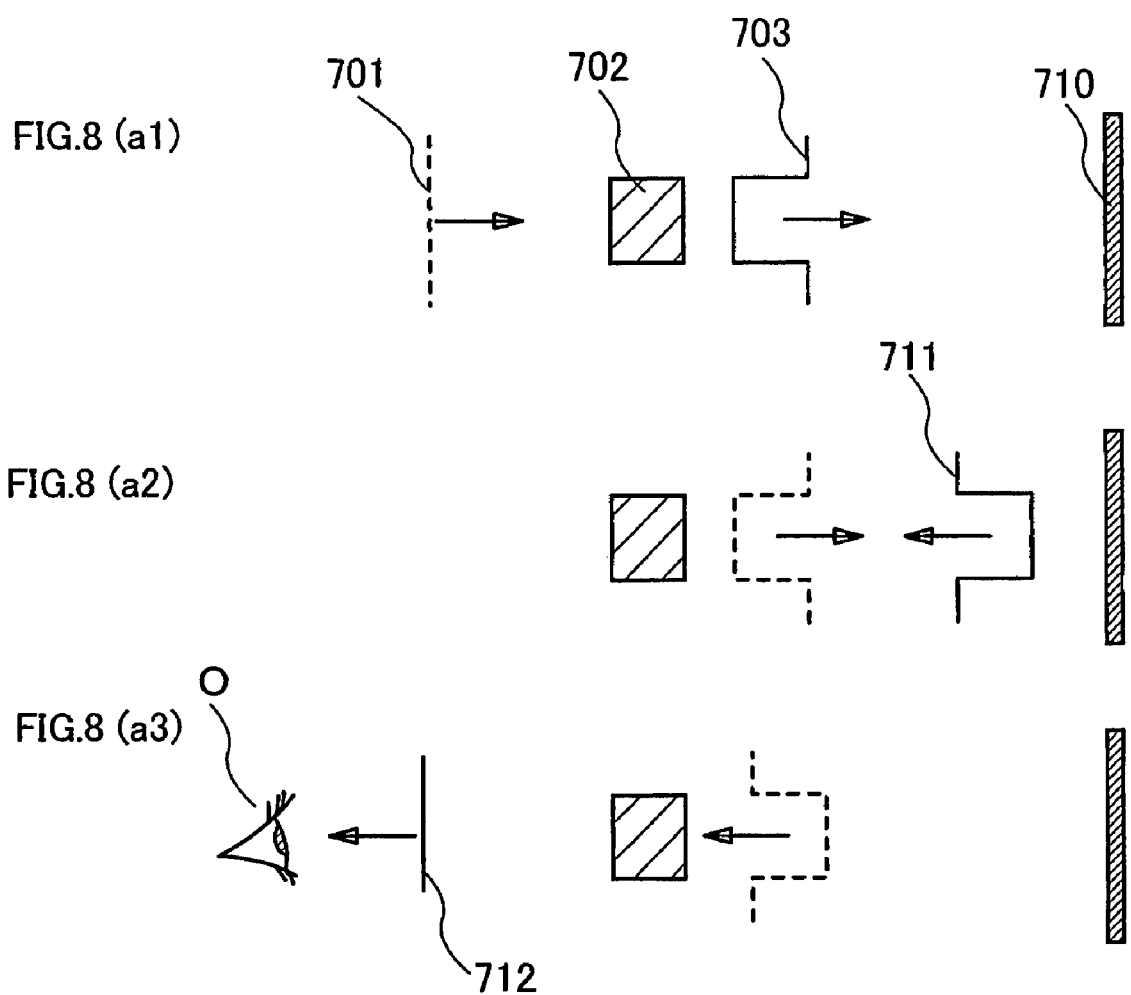

$1/f = 1/d_1 + 1/d_2$
$d_1 : d_2 = a : b$ (x) threshold at which crystalline region is formed
(y) threshold at which large crystalline region is formed

LASER IRRADIATION APPARATUS AND LASER IRRADIATION METHOD

TECHNICAL FIELD

The present invention relates to a laser irradiation apparatus (apparatus including a laser and an optical system for guiding a laser beam emitted from the laser to an irradiation object) and a laser irradiation method, which are for annealing a semiconductor material or the like homogeneously and effectively. Moreover, the present invention relates to a semiconductor device manufactured by including a step of carrying out a process using these laser process apparatus and laser process method, and also relates to a manufacturing method thereof.

BACKGROUND ART

In recent years, a technique for manufacturing a thin film transistor (hereinafter referred to as a TFT) over a substrate has drastically progressed and development for applying a TFT to an active matrix display device has been advanced. In particular, since a TFT using a polycrystalline semiconductor film has higher electric field effect mobility (also referred to as mobility, simply) than a conventional TFT using an amorphous semiconductor film, high speed operation is possible. Therefore, it has been attempted that a pixel, which has been controlled by a driver circuit provided outside a substrate, is controlled by a driver circuit provided over the same substrate as the pixel.

A substrate used for a semiconductor device is expected to be a glass substrate rather than a quartz substrate or a single-crystal semiconductor substrate in terms of cost. However, a glass substrate is inferior in heat resistance and Easy to be deformed due to heat. Therefore, when a semiconductor film formed over a glass substrate is crystallized to form a TFT using a polycrystalline semiconductor film, laser annealing is often employed in order to prevent the glass substrate from being deformed due to heat.

Compared with another annealing method which uses radiation heat or conduction heat, the laser annealing has advantages that the process time can be shortened drastically and that a semiconductor substrate or a semiconductor film over a substrate can be heated selectively and locally so that thermal damage is hardly given to the substrate. The laser annealing method described here indicates a technique to recrystallize an amorphous layer or a damaged layer formed in a semiconductor substrate or a semiconductor film, and a technique to crystallize a non-single crystal semiconductor film formed over a substrate. Further, a technique applied to planarization or modification of the surface of a semiconductor substrate or a semiconductor film is also included.

Laser oscillators used for the laser annealing can be roughly categorized into pulsed laser oscillators and continuous wave laser oscillators according to the oscillation method. In recent years, it has been known that the size of a crystal grain formed in a semiconductor film becomes larger when using a continuous wave laser oscillator such as an Ar laser or a $YVO_4$ laser than when using a pulsed laser oscillator such as an excimer laser in crystallizing the semiconductor film. When the size of the crystal grain in the semiconductor film becomes larger, the number of crystal grain boundaries in a channel region of a TFT formed using this semiconductor film decreases, and the carrier mobility becomes higher, so that a more sophisticated device can be developed. For this reason, a continuous wave laser oscillator is attracting attention.

In general, a laser beam which is used for laser annealing of a semiconductor film has a linear spot shape and the laser annealing is conducted by moving the linear spot of the laser beam on the semiconductor film. By shaping the laser beam into the linear spot, the area annealed by the laser beam at one time can be made larger. In this specification, laser beams having a linear shape and a rectangular shape on an irradiation surface are referred to as a linear beam and a rectangular beam, respectively. It is to be noted that the term of "linear" herein used does not mean a line in a strict sense but means a rectangle having a high aspect ratio (for example, aspect ratio of 10 or higher (preferably 100 to 10000)). The laser beam is shaped into a linear spot because energy density required for sufficient annealing to an irradiation object can be secured. Therefore, as long as sufficient annealing can be conducted to the irradiation object, the laser beam may be shaped into a rectangular or planar spot. In the future, there is possibility that laser annealing is conducted with a planar beam.

On the other hand, when a silicon film having a thickness of several tens to several hundred nm, which is generally used in a semiconductor device, is crystallized with a YAG laser or a $YVO_4$ laser, a second harmonic having a shorter wavelength than the fundamental wave is used. This is because the second harmonic has higher absorption coefficient of a laser beam to a semiconductor film than the fundamental wave and the semiconductor film can be crystallized effectively with the second harmonic. The fundamental wave is rarely used in this step.

An example of this step is as follows: a CW (continuous wave) laser beam converted into a second harmonic having a wavelength of 532 nm and a power of 10 W is shaped into a linear beam spot with a length of about 300 μm in a major-axis direction and about 10 μm in a minor-axis direction and this linear beam is moved in the minor-axis direction, thereby conducting laser annealing. Thus, crystallization is performed. The width of a region where a large grain crystal is obtained by one scan is approximately 200 μm (hereinafter, a region where a large grain crystal is observed is referred to as a large grain region). Therefore, in order to crystallize the whole surface of the substrate by laser annealing, it is necessary to carry out laser annealing in such a way that a position from which a laser beam is moved is displaced in a major-axis direction of a beam spot by a width of a large grain region obtained by one scan of the beam spot.

The present applicant has already made the invention in which a semiconductor film is irradiated with a laser beam shaped into a linear beam at or in the vicinity of an irradiation surface, and filed patent application (see, Japanese Patent Application Laid-Open No. 2003-257885).

DISCLOSURE OF INVENTION

FIG. 25 shows a beam spot 2500 and an irradiation track 2501 on a semiconductor film when the semiconductor film is irradiated with the beam spot 2500 and also shows intensity distribution 2502 at a cross section taken along a line a-a' of the beam spot 2500.

In general, the cross section of a laser beam emitted from a CW laser oscillator with $TEM_{00}$ (single transverse mode) has Gaussian intensity distribution as shown with a reference numeral 2502 in FIG. 25, and does not have homogeneous distribution.

For example, the intensity of a central portion 2500a of the beam spot 2500 is set higher than a threshold (y) at which one crystal grain that is large enough to form at least one TFT therein is obtained (hereinafter, such a crystal grain is referred to as a large crystal grain). The intensity of an end portion 2500*b* of the beam spot is set higher than a threshold (x) at which a crystalline region is formed and is lower than the threshold (y). Therefore, when the semiconductor film is irradiated with such a beam spot 2500, some parts of a region irradiated with the end portion of the beam spot are not melted completely in the irradiation track 2501. In this not-melted region, not the large grain crystal which is formed in a region 2501*a* by the center of the beam spot but only a crystal grain having relatively small grain diameter (hereinafter referred to as a microcrystal) is formed.

A semiconductor element formed in the region where the microcrystal is formed in this way, that is, the region 2501*b* irradiated with the end portion of the beam spot cannot be expected to have superior characteristics. In order to avoid this, it is necessary to form the semiconductor element in the region where the large crystal grain is formed, that is, the region 2501*a* irradiated with the central portion of the beam spot. In such a case, it is apparent that the layout is restricted. Accordingly, it is required to decrease the proportion of the region where the microcrystal is formed in the whole region irradiated with the laser beam.

In order to avoid this, such a method is given that intensity distribution of a laser beam is changed into a top-flat shape, not a Gaussian shape. By having a top-flat shape, it is possible to sharpen an end portion of intensity distribution of a laser beam, thereby decreasing a crystallinity-inferior region formed after laser annealing.

A laser beam has high directivity because of a characteristic structure of a laser resonator, and has coherency. However, high coherency sometimes leads to a problem. As shown in FIG. 26, a laser beam emitted from a laser oscillator 2601 reaches a slit 2603 after intensity distribution of the laser beam is homogenized by a diffractive optical element 2602. The laser beam is diffracted by passing through the slit 2603 and then reaches an irradiation surface 2604. By the interference of the diffracted light, diffraction stripes having the intensity distribution shown with a reference numeral 2605 appears at the irradiation surface 2604. When a laser irradiation process is carried out to a semiconductor film with such intensity distribution, it is difficult to anneal the whole surface of the semiconductor film homogeneously.

In order to solve the above problem, the present invention has the following structure. It is to be noted that the laser annealing method herein described indicates a technique to crystallize an amorphous region or a damaged region formed by, for example, implanting ions into a semiconductor substrate or a semiconductor film; a technique to crystallize a semiconductor film which is not single crystal (referred to as a non-single crystal semiconductor film) formed over a substrate by irradiating the semiconductor film with a laser beam; a technique to crystallize a non-single crystal semiconductor film by conducting laser irradiation after introducing a crystallization-promoting catalytic element such as nickel into the non-single crystal semiconductor film; and so on.

Moreover, a technique applied to flattening or modification of a surface of a semiconductor substrate or a semiconductor film is also included. A semiconductor device herein described indicates all the devices which can operate by using a semiconductor characteristic and includes electro-optic devices such as a liquid crystal display device and a light-emitting device, and also includes an electronic device having such an electro-optic device as its component.

An aspect of the present invention includes a laser oscillator, a beam homogenizer for homogenizing intensity distribution of a laser beam emitted from the laser oscillator, a slit for blocking opposite end portions of the laser beam emitted from the laser oscillator, a projecting lens for projecting an image of the slit to an irradiation surface, a condensing lens for condensing the image of the slit, and a means for moving the irradiation surface relative to the laser beam.

In the present invention, the laser beam may enter the beam homogenizer for homogenizing intensity distribution of the laser beam after a phase of the laser beam is aligned by operating a phase conjugate mirror.

In the present invention, the beam homogenizer is a diffractive optical element.

In the present invention, the projecting lens is a convex cylindrical lens or a convex spherical lens. It is preferable that the following formulas (1) and (2) are satisfied where "a" is a width of an opening portion of the slit, "b" is a length of a major axis of the laser beam on the irradiation surface, "f" is a focal length of the projecting lens, "$d_1$" is a distance from a surface of the slit on an emission side (hereinafter referred to as a rear surface) to a first principal point of the projecting lens, and "$d_2$" is a distance from a second principal point of the projecting lens to the irradiation surface.

$$1/f = 1/d_1 + 1/d_2 \qquad \text{formula (1)}$$

$$d_1 : d_2 = a : b \qquad \text{formula (2)}$$

That is, the projecting lens is disposed at a position so that the rear surface of the slit and the irradiation surface are conjugated. Thus, the image of the slit can be condensed so as to form one image again on the irradiation surface.

In the present invention, the condensing lens is a convex cylindrical lens or a convex spherical lens.

In the present invention, the laser oscillator may be a continuous wave laser (hereinafter referred to as a CW laser) or a pulsed laser with a repetition rate of 10 MHz of higher. A laser having a medium of a single-crystal YAG, $YVO_4$, forsterite, $YAlO_3$, or $GdVO_4$ or a polycrystalline YAG, $Y_2O_3$, $YVO_4$, $YAlO_3$, or $GdVO_4$, each of which is doped with one or a plurality of elements selected from Nd, Yb, Cr, Ti, Ho, Er, Tm, and Ta; an Ar ion laser; a Ti:sapphire laser; or the like can be used. These lasers can oscillate either in a CW manner or in a pulsed manner with a repetition rate of 10 MHz or higher by conducting Q-switch operation or mode locking.

In an annealing process of a semiconductor film, not only a CW laser but also a pulsed laser with high repetition rate can be used. The pulsed laser with high repetition rate has the following advantages. A period after a semiconductor film is irradiated with a laser beam and before the semiconductor film is completely solidified is said to range from several tens to several hundred ns. Therefore, if a pulsed laser with low repetition rate is used, a pulsed laser beam is delivered after a semiconductor film melted by the previous laser beam is solidified. Accordingly, at the recrytallization after the irradiation of the respective pulsed laser beams, a crystal grain grows in a radiant manner centrosymmetrically. Then, a grain boundary is formed at a boundary between the adjacent crystal grains, which causes unevenness on the surface of the semiconductor film.

When a pulsed laser with high repetition rate is used, a semiconductor film is irradiated with a laser beam after the semiconductor film is melted by the previous laser beam and before the melted semiconductor film is solidified. Therefore, unlike in the case of using a pulsed laser having low repetition rate, an interface between a solid phase and a liquid phase can be moved continuously in the semiconductor film; therefore, the semiconductor film having the crystal grain grown continuously in a direction where the laser beam is moved can be obtained.

Moreover, another advantage of the pulsed laser is that the peak power per pulse can be raised by increasing the repetition rate. Thus, it is possible to increase the conversion efficiency of a laser beam into a second harmonic even though the laser beam has a relatively low power on average. Therefore, since the higher harmonic of high power can be easily obtained, the productivity can be raised drastically.

In the case of using a laser oscillator that includes a single-crystal medium, a laser beam is shaped into a laser beam with a length of 0.5 to 1 mm in a major-axis direction and a length of 20 µm or less, preferably 10 µm or less, in a minor-axis direction on an irradiation surface. The laser beam is moved in the minor-axis direction. Then, an aggregation of crystal grains each having a width of about 10 to 30 µm in a moving direction of the laser beam and about 1 to 5 µM in a direction perpendicular to the moving direction can be formed all over a surface of a region irradiated with the laser beam. In this way, a crystal grain with a similar size to a crystal grain obtained by using a CW laser can be formed. By forming a single-crystal grain extending long in the moving direction of the beam, it is possible to form a semiconductor film having almost no crystal grain boundaries at least in a moving direction of carriers in a TFT.

In the case of using a laser oscillator that includes a polycrystalline medium, a laser beam can be emitted with extremely high power. In such a case, the beam size can be enlarged. The length of a minor axis of the beam may be set to be 1 mm or less, and that of the major axis is set so that a semiconductor film can be favorably annealed.

In the present invention, a beam converted into a higher harmonic by a non-linear element can be used as the laser beam. As the non-linear element, BBO ($\beta$-BaB$_2$O$_4$, barium borate), LBO (Li$_2$B$_4$O$_7$, lithium borate), KTP (KTiOPO$_4$, kalium titanyl phosphate), LiNbO$_3$ (lithium niobate), KDP (KH$_2$PO$_4$, kalium dihydrogen phosphate), LiIO$_3$ (lithium iodate), ADP (NH$_4$H$_2$PO$_4$, ammonium dihydrogen phosphate), BIBO (BiB$_3$O$_6$, bismuth triborate), CLBO (CsLiB$_6$O$_{10}$, cesium lithium borate), KB5 (KB$_5$O$_8$.4H$_2$O, potassium pentaborate), or the like can be used.

In the above structure of the present invention, an incidence angle of the laser beam emitted from the laser oscillator to the irradiation surface may be appropriately set.

Moreover, a thin film transistor (TFT) can be formed with a crystalline semiconductor film obtained by the present invention, and a semiconductor device can be manufactured by using the TFT. The semiconductor device is, typically, a CPU (central processing unit), a memory, an IC, an RFID element, a pixel, a driver circuit, or the like. Moreover, by incorporating these semiconductor devices, various electronic appliances can be formed, such as a television, a computer, and a mobile information processing terminal.

A laser beam with homogeneous intensity distribution can be delivered without generating interference stripes on an irradiation surface. Therefore, a laser process can be performed to a semiconductor film homogeneously.

BRIEF DESCRIPTION OF DRAWINGS

In the accompanying drawings:

FIGS. 7 (a1) to 7 (a3) describe reflection of light by a mirror;

FIGS. 8 (a1) to 8 (a3) describe reflection of light by a phase conjugate mirror;

BEST MODE FOR CARRYING OUT THE INVENTION

Embodiment Modes

Embodiment modes and embodiments of the present invention will be hereinafter described with reference to the drawings. However, since the present invention can be carried out with many different modes, it is easily understood by those skilled in the art that the modes and detail of the present invention can be variously modified without departing from the scope and spirit of the present invention. Therefore, the present invention is no construed as being limited by the description of the embodiment modes and embodiments.

Embodiment Mode 1

An embodiment mode of the present invention is described with reference to FIGS. 1 to 4C.

Figure 1:
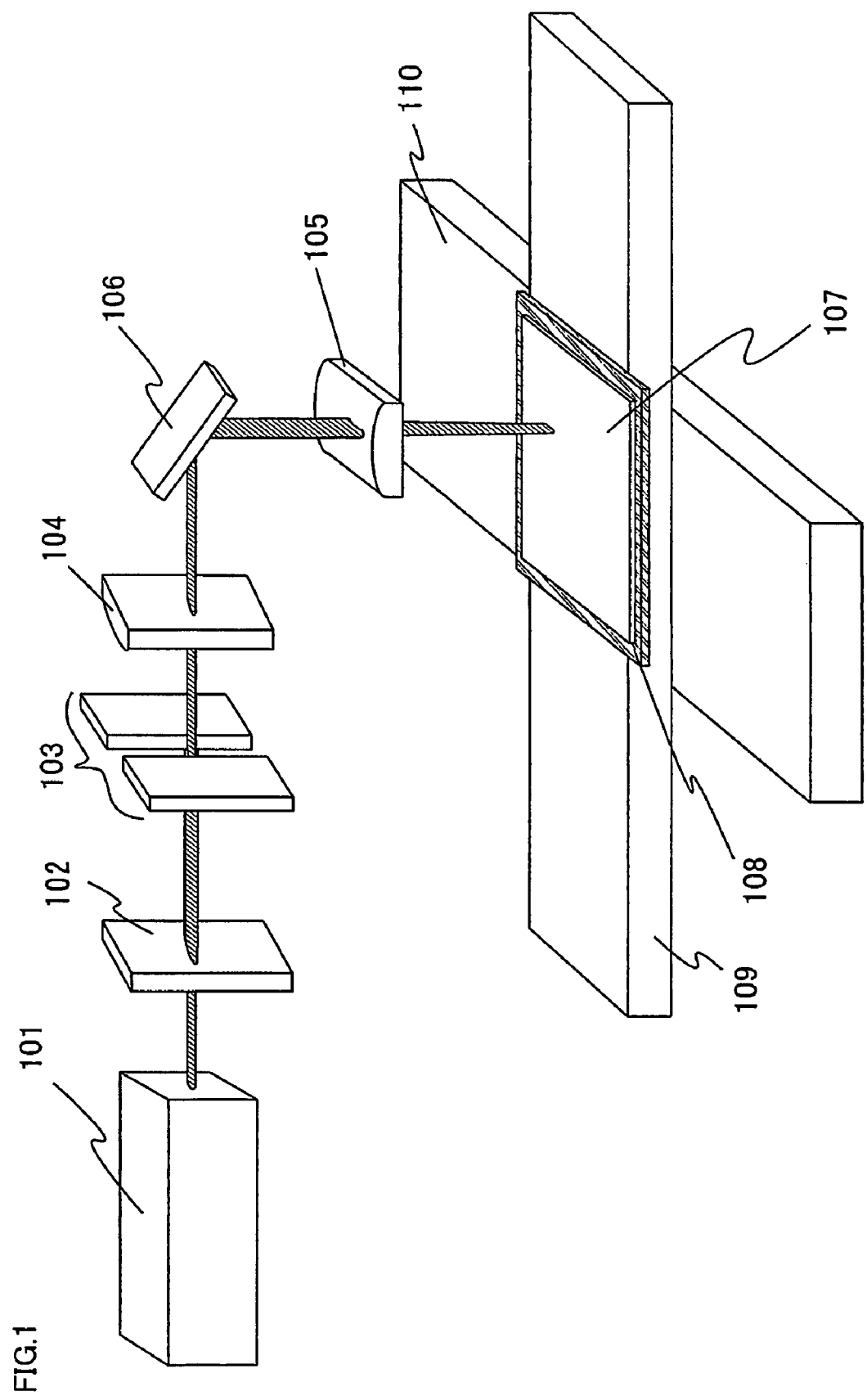
FIG. 1 schematically shows a laser irradiation apparatus.

FIG. 1 shows an example of a laser irradiation apparatus. The laser irradiation apparatus includes a laser oscillator 101, a diffractive optical element (also referred to as a diffractive optics element or diffractive optics) 102, a slit 103, a projecting lens 104, and a condensing lens 105. Although the projecting lens 104 is a convex cylindrical lens in this embodiment mode, a convex spherical lens can also be used. Moreover, although the condensing lens 105 is a convex cylindrical lens, a convex spherical lens may also be used. A mirror 106 may be provided in accordance with a setting condition of an optical system in the laser irradiation apparatus.

The laser oscillator 101 may be a CW laser or a pulsed laser with a repetition rate of 10 MHz or higher. As a kind of the laser, a laser having a medium of a single-crystal YAG, $YVO_4$, forsterite, $YAlO_3$, or $GdVO_4$ or a polycrystalline YAG, $Y_2O_3$, $YVO_4$, $YAlO_3$, or $GdVO_4$, each of which is doped with one or a plurality of elements selected from Nd, Yb, Cr, Ti, Ho, Er, Tm, and Ta; an Ar ion laser; a Ti:sapphire laser; or the like can be used. These lasers can oscillate either in a CW manner or in a pulsed manner with a repetition rate of 10 MHz or higher by conducting Q-switch operation or mode locking.

Figure 2A:
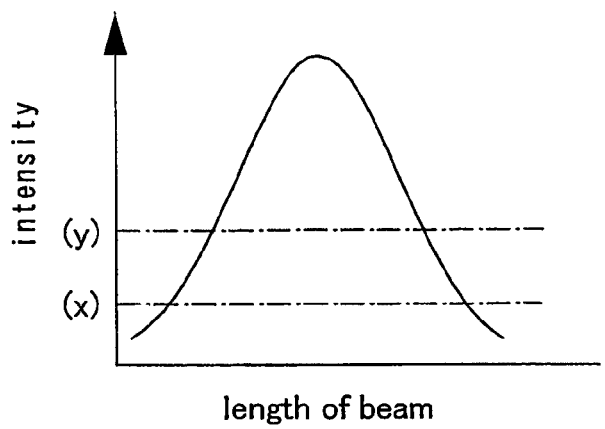
FIGS. 2A to 2C describe a function of the laser irradiation apparatus shown in FIG. 1.
Figure 2B:
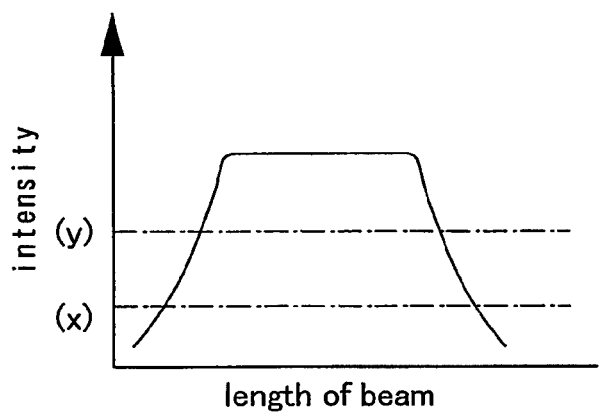

The laser beam emitted from the laser oscillator 101 has the intensity distribution shown in FIG. 2A. By passing through the diffractive optical element 102, the cross section of the laser beam can have a linear, square, or elliptical shape as well as the intensity distribution of the laser beam is homogenized. The intensity distribution of the laser beam having passed through the diffractive optical element 102 is as shown in FIG. 2B. As the diffractive optical element 102, an element by which spectrum is obtained using diffraction of light and which has a function like a condensing lens by forming a number of grooves on its surface is used.

Figure 2C:
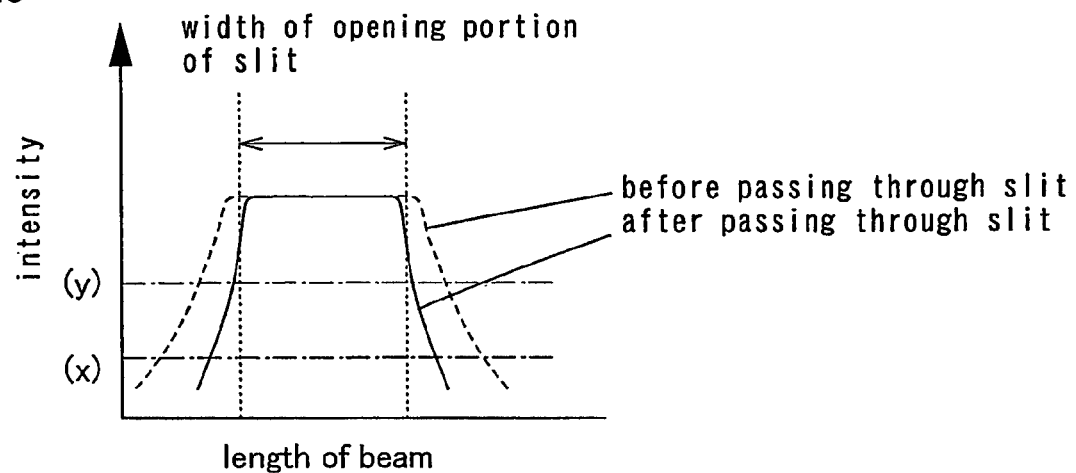
Figure 3:
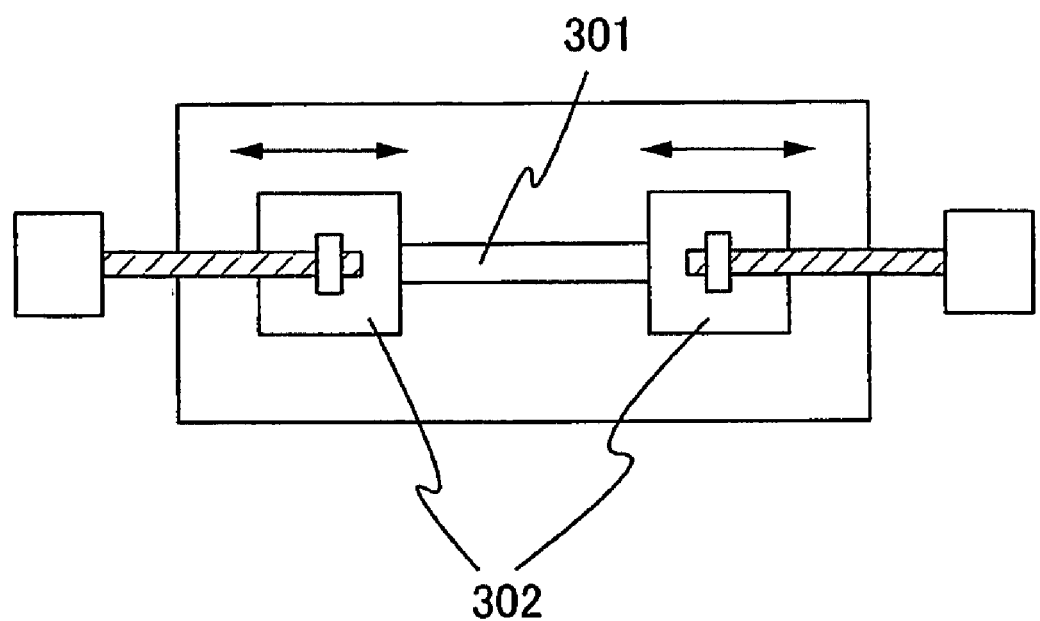
FIG. 3 shows an example of a slit.

Next, this beam passes through the slit 103. The slit 103 is disposed so as to act in the major-axis direction of the beam whose cross section is made to have a linear, square, or elliptical shape by the diffractive optical element 102. The material, adjusting method, and the like of the slit 103 are not limited in particular as long as the slit 103 can block a low-intensity region at opposite ends of the beam, and at the same time, adjust the length of the beam in the major-axis direction. For example, as shown in FIG. 3, an opening portion 301 is provided in the central portion of the slit 103 and then opposite end portions of the opening portion 301 in the major-axis direction can be adjusted by opening and closing a blocking plate 302. The opening and closing can be controlled by a motor drive method or an adjusting method by screw driving. When the laser beam passes through the slit 103, the end portion of the beam in the major-axis direction is blocked, so that the laser beam having the intensity distribution shown by a dotted line of FIG. 2C is changed into a laser beam having the intensity distribution shown by a solid line of FIG. 2C.

Figure 4A:
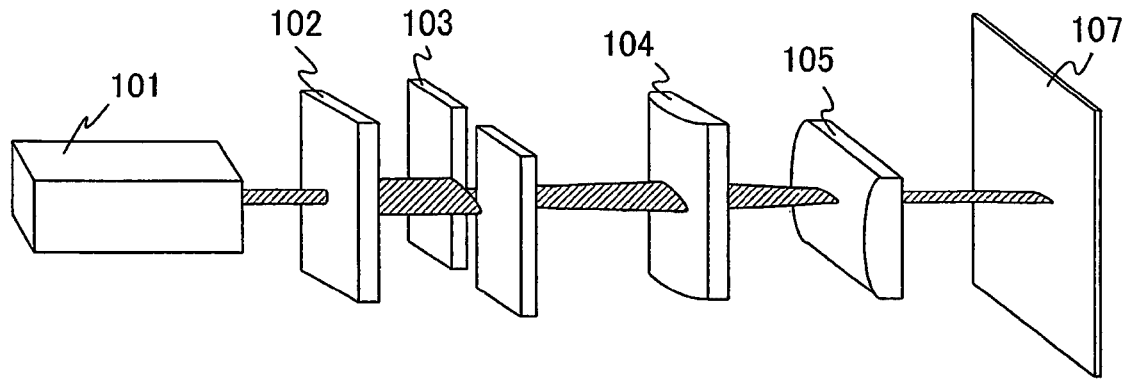
FIGS. 4A to 4C show the detail of an optical system of a laser irradiation apparatus.
Figure 4B:
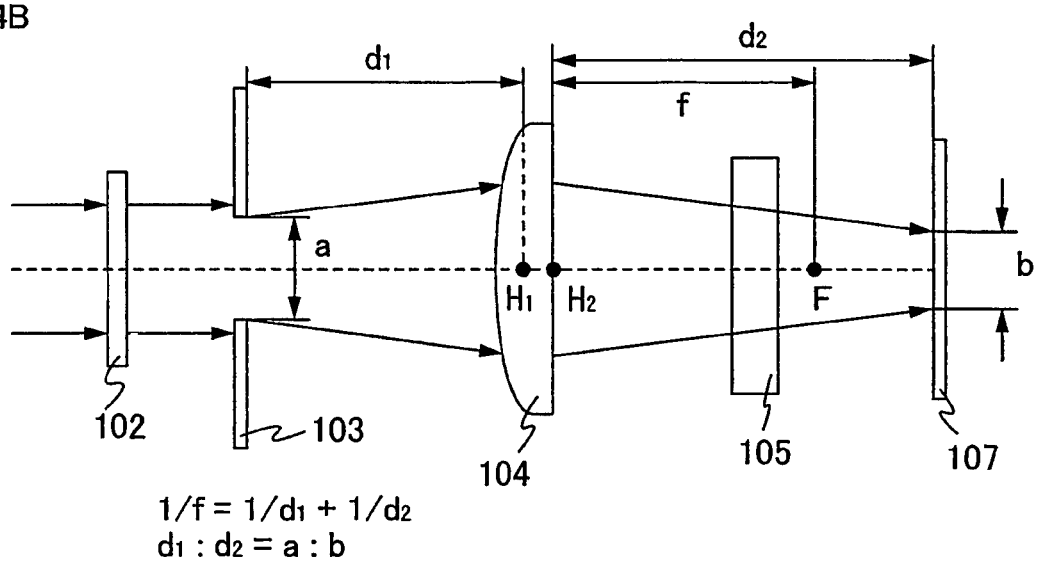
Figure 4C:
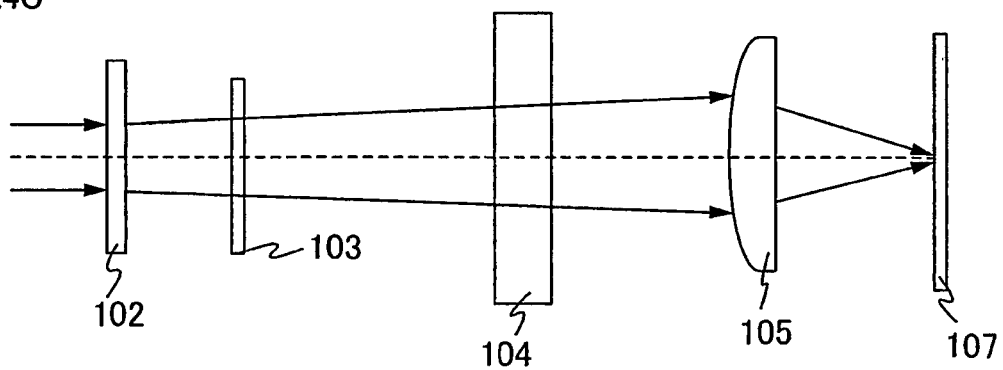

After passing through the slit 103, the laser beam passes through the projecting lens 104. The projecting lens 104 is provided so that an image of the slit 103 is formed on a semiconductor film 107, which is the irradiation surface, after the image passes through the projecting lens 104. With reference to FIGS. 4A to 4C, the arrangement of the optical system in this embodiment mode is described in detail. FIG. 4A shows the optical system used in this embodiment mode. FIG. 4B is a top view and FIG. 4C is a side view.

Here, the following formulas (1) and (2) are satisfied where "a" is a width of the opening portion of the slit 103, "b" is a length of a major axis of the laser beam on the semiconductor film 107, "f" is a focal length of the projecting lens 104, "$d_1$" is a distance from a rear surface of the slit 103 (a surface from which a beam is emitted) to a first principal point $H_1$ of the projecting lens 104, and "$d_2$" is a distance from a second principal point $H_2$ of the projecting lens 104 to the semiconductor film 107, as shown in FIG. 4B. By arranging the optical system in this way, an image with a length of "a" at the opening portion of the slit 103 is projected to the semiconductor film 107 by the projecting lens 104 as an image with a length of "b" in the major-axis direction.

$$1/f = 1/d_1 + 1/d_2 \quad \text{formula (1)}$$

$$d_1:d_2 = a:b \quad \text{formula (2)}$$

As shown in FIGS. 4B and 4C, it is preferable that the laser beam be condensed in the minor-axis direction. Therefore, a convex cylindrical lens is used as the condensing lens 105 in this embodiment mode. Since the convex cylindrical lens has curvature only in one direction, the beam can be extended only in a direction of the curvature. The convex cylindrical lens may have a convex surface/convex surfaces on either one or both of an incidence side and an emission side. However, it is preferable that the convex surface be formed on the incidence side in consideration of low aberration and accuracy. The material of the convex cylindrical lens is not limited. The condensing lens 105 only needs to be provided behind the slit 103, and may be provided before the projecting lens 104.

In this embodiment mode, after changing a traveling direction of the laser beam by the mirror 106 so that an optical path of the laser beam is directed to the semiconductor film 107, the laser beam enters the condensing lens 105. In the case of a laser with an output power of 20 W, a linear, square, or elliptical beam spot whose cross section has a length of 0.5 to 1 mm in the major-axis direction and 20 μm or less (preferably 10 μm or less) in the minor-axis direction is formed on the semiconductor film 107. In the case of using a laser that includes a medium of a polycrystalline $Y_2O_3$, YAG, $YVO_4$, $YAlO_3$, or $GdVO_4$, it is possible to emit a laser having much higher intensity than in the case of using a single-crystal medium. Therefore, the length of the cross section of the laser beam in the major-axis direction on the semiconductor film 107 is not limited to the above length. Moreover, an incident direction of the laser beam after being changed by the mirror 106 may be perpendicular or oblique to the semiconductor film 107.

Conventionally, the diffracted light caused by passing through the slit has reached the semiconductor film to form interference stripes. However, by arranging the optical system like in this embodiment mode, the semiconductor film 107 can be irradiated with the laser beam having homogeneous intensity distribution without forming interference stripes.

The substrate over which the semiconductor film 107 is formed is made of an insulating material, and the substrate is fixed to a suction stage 108 so as not to fall at the laser irradiation. The suction stage 108 moves in an X-axis direction and a Y-axis direction on a plane parallel to the surface of the semiconductor film 107 by using an X stage 109 and a Y stage 110, whereby the whole surface of the semiconductor film 107 is crystallized.

In this embodiment mode, the substrate over which the semiconductor film 107 is formed is moved by using the X stage 109 and the Y stage 110; however, the laser beam may be moved by any of the following methods: (1) an irradiation system moving method in which an irradiation position of a laser beam is moved while the substrate as a process object is fixed; (2) a process object moving method in which the substrate is moved while the irradiation position of the laser beam is fixed; and (3) a method in which the methods (1) and (2) are combined.

By using these optical systems, the intensity distribution of the laser beam to be delivered to the irradiation surface can be homogenized and a part of the laser beam having insufficient intensity at the end portion thereof can be removed. Moreover, it is possible to prevent that the diffracted light generated by passing through the slit 103 reaches the semiconductor film 107 to form the interference stripes. By having such a structure, a laser irradiation process can be favorably conducted to the whole surface of the semiconductor film 107.

By manufacturing a semiconductor device with the use of such a semiconductor film, the performance of the semiconductor device can be drastically improved. For example, a TFT is taken up as an example. Since the number of crystal grain boundaries included in a channel formation region can be decreased, it is possible to obtain electric field-effect mobility (also referred to as mobility, simply) which is equal to or more than that of a TFT using a single-crystal semiconductor and to decrease variation in an on-current value (the amount of drain current flowing when a TFT is in an on-state), an off-current value (the amount of drain current flowing when a TFT is in an off-state), threshold voltage, an S value, and electric field-effect mobility. With these advantageous effects, the electrical characteristic of the TFT improves and the operating characteristic and reliability of the semiconductor device using the TFT improve. In particular, since there are almost no grain boundaries in a direction where the laser beam is moved, it is preferable to form the channel formation region of the TFT along this direction because the TFT characteristic improves.

Embodiment Mode 2

This embodiment mode will describe another optical system which is applicable in a laser irradiation apparatus of the present invention.

Figure 5A:
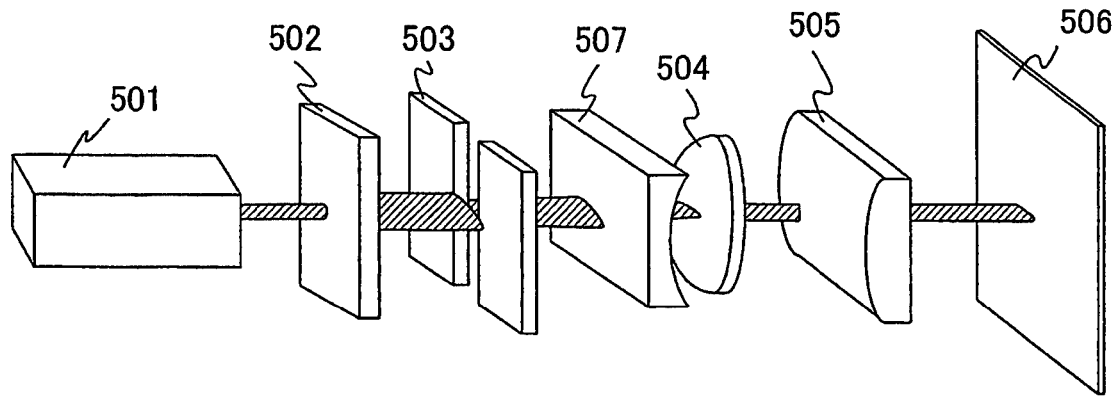
FIGS. 5A to 5C show the detail of an optical system of a laser irradiation apparatus.
Figure 5B:
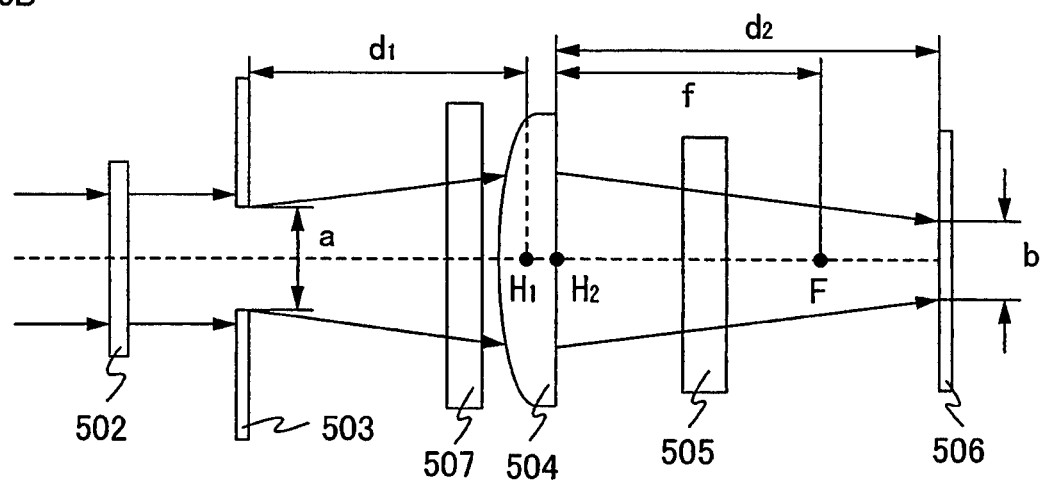
Figure 5C:
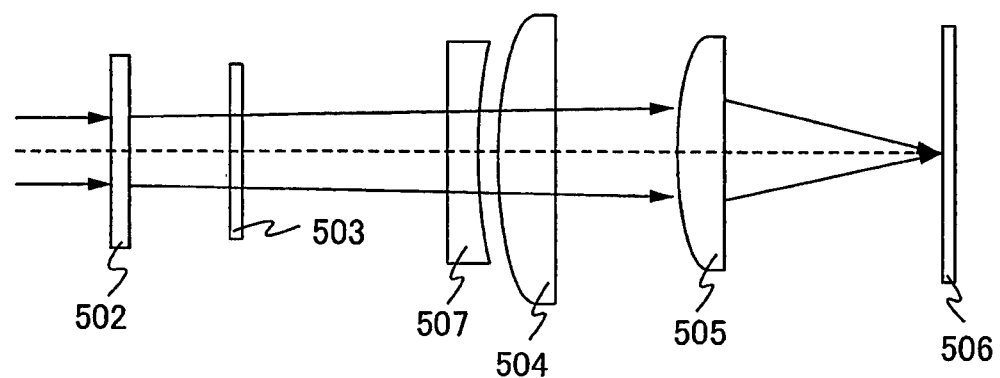

FIG. 5A shows an optical system used in this embodiment mode. FIG. 5B is a top view and FIG. 5C is a side view.

In Embodiment Mode 1, as shown in FIG. 5A, a convex cylindrical lens is used as the projecting lens 104 and a convex cylindrical lens is used as the condensing lens 105. Meanwhile, in this embodiment mode, a convex spherical lens is used as the projecting lens, a convex cylindrical lens is used as the condensing lens, and a concave cylindrical lens is used as a correcting lens. Except the projecting lens, the condensing lens, and the correcting lens, the same lenses as those in Embodiment Mode 1 may be used.

As shown in FIG. 5A, a laser beam emitted from a laser oscillator 501 passes through a diffractive optical element 502, whereby beam shaping and homogenization of beam intensity are carried out. Moreover, after blocking an end portion of the beam in the major-axis direction by a slit 503, the laser beam passes through a correcting lens 507 and a projecting lens 504. The projecting lens 504 is provided so that an image of the slit 503 is formed on a semiconductor film 506.

As shown in FIG. 5B, the above-described formulas (1) and (2) are satisfied where "a" is a width of an opening portion of the slit 503, "b" is a length of a major axis of the laser beam on the semiconductor film 506, "f" is a focal length of the projecting lens 504, "$d_1$" is a distance from a second surface of the slit 503 to a first principal point $H_1$ of the projecting lens 504, and "$d_2$" is a distance from a second principal point $H_2$ of the projecting lens 504 to the semiconductor film 506. By arranging the optical system in this way, an image with a length of "a" at the opening portion of the slit 503 is projected to the semiconductor film 506 by the projecting lens 504.

Moreover, as described in Embodiment Mode 1, it is preferable that the laser beam be condensed in the minor-axis direction of the laser beam. In this embodiment mode, since the projecting lens 504 is a convex spherical lens, the laser beam is condensed in the major-axis direction and the minor-axis direction by the projecting lens 504. Here, by using the convex spherical lens as the projecting lens 504, spherical aberration can be suppressed, whereby the laser beam can be condensed to be smaller. In order to suppress the effect of the laser beam in the major-axis direction due to the projecting lens 504, a concave cylindrical lens is arranged as the correcting lens 507 just before the projecting lens 504 so as to act in the major-axis direction of the laser beam.

Although a mirror is not shown in this embodiment mode, a mirror may be provided between the projecting lens 504 and the condensing lens 505 like in Embodiment Mode 1. At that time, an incident direction of the laser beam after being changed by the mirror may be perpendicular or oblique to the semiconductor film 506. The condensing lens 505 only needs to be set behind the slit 503 and may be set before the correcting lens 507 and the projecting lens 504.

By arranging the optical system in this way, the intensity distribution of the laser beam to be delivered can be homogenized and an intensity-insufficient part at the end portion of the beam can be removed. Moreover, it can be prevented that the diffracted light generated by passing through the slit 503 reaches the semiconductor film 506 to form interference stripes. By having such a structure, the beam having homogeneous intensity distribution can be delivered to the whole surface of the semiconductor film 506.

Embodiment 1

Embodiment 1 will describe an example of a laser irradiation apparatus. Specifically, an example of using an aggregation of polycrystals as a laser medium will be described.

Figure 6:
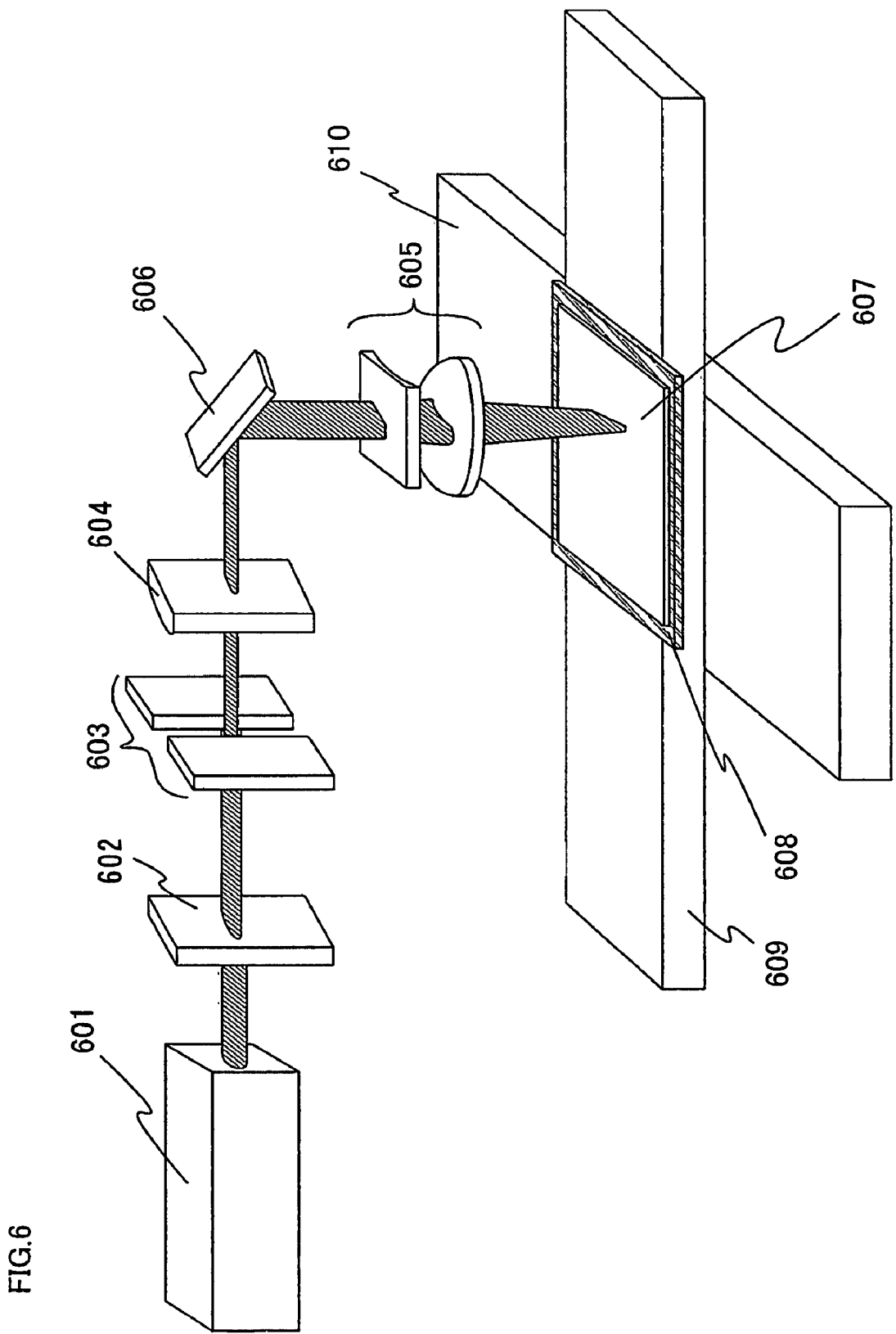
FIG. 6 schematically shows a laser irradiation apparatus.

FIG. 6 shows an example of the laser irradiation apparatus. The laser irradiation apparatus includes a laser oscillator 601, a diffractive optical element 602, a slit 603, a projecting lens 604, and a condensing lens 605. The laser oscillator 601 in this embodiment uses a YAG crystal having a ceramic structure that includes a polycrystal aggregation (hereinafter such a YAG crystal is referred to as a ceramic YAG) as a laser crystal and emits a pulsed laser beam with a repetition rate of 10 MHz or higher. Although a mirror 606 is used in this embodiment, the mirror may be provided in accordance with a setting condition of the optical system in the laser irradiation apparatus.

As shown in FIG. 6, a laser beam emitted from the laser oscillator 601 enters the diffractive optical element 602. The diffractive optical element 602 changes a cross section of the laser beam into a linear, square, or elliptical shape as well as homogenizing the intensity distribution of the laser beam. As the diffractive optical element 602, an element by which spectrum is obtained using diffraction of light and which has a function like a condensing lens by forming a number of grooves on its surface is used. The light having passed through the diffractive optical element 602 forms an image thereof at the slit 603.

The material, adjusting method, and the like of the slit 603 are not particularly limited as long as the slit has a structure or a shape which can block a low-intensity region of the laser beam at its opposite ends. By using the slit 603 to block the end portion of the laser beam, the intensity of the laser beam can be homogenized further.

After passing through the slit 603, the laser beam enters the projecting lens 604. Here, the projecting lens 604 is provided so that the image of the slit 603 is formed on the semiconductor film 607 after passing through the projecting lens 604. That is, the projecting lens 604 is disposed so that the image of the slit 603 and the semiconductor film 607 are conjugated. At this time, the above-mentioned formulas (1) and (2) are satisfied where "a" is a width of an opening portion of the slit 603, "b" is a length of a major axis of the laser beam on the semiconductor film 607, "f" is a focal length of the projecting lens 604, "$d_1$" is a distance from a rear surface of the slit 603 to a first principal point of the projecting lens 604, and "$d_2$" is a distance from a second principal point of the projecting lens 604 to the irradiation surface.

By arranging the optical system in this way, it can be prevented that the diffracted light generated by passing through the slit 603 reaches the semiconductor film 607 to form the interference stripes. By having such a structure, the laser beam having homogeneous intensity distribution can be delivered to the semiconductor film 607.

Moreover, a traveling direction of the laser beam is changed by the mirror 606 so that an optical path of the laser beam is directed to the semiconductor film 607. Moreover, an incident direction of the laser beam after being changed by the mirror 606 may be perpendicular or oblique to the semiconductor film 607.

After that, a convex spherical lens and a concave cylindrical lens, which serve as the condensing lens 605, are used to condense the laser beam. Since spherical aberration can be suppressed to be low by using the convex spherical lens, the laser beam can be condensed to be smaller. Moreover, the concave cylindrical lens is used to decrease the effect of the convex spherical lens on the major-axis direction of the laser beam; therefore, the concave cylindrical lens is provided just before the convex spherical lens so as to act in the major-axis direction of the laser beam. The structure and material of the convex spherical lens are not limited. For example, the convex spherical lens may have a convex surface/convex surfaces on either one or both of an incidence side and an emission side. However, it is preferable that the convex surface be formed on an incidence side in consideration of low aberration and accuracy. If necessary, two or more convex cylindrical lenses may be provided so as to independently act in the major-axis direction and the minor-axis direction of the laser beam.

A substrate over which the semiconductor film 607 is formed is made of an insulating material. Specifically, a glass substrate made of aluminoborosilicate glass, barium borosilicate glass, or the like; a quartz substrate; a ceramic substrate; a stainless steel substrate; a substrate formed with a synthetic resin typified by acrylic or plastic, typically PET (polyethylene terephthalate), PES (polyethersulfone resin), or PEN (polyethylene naphthalate); or the like can be used. The substrate is fixed onto a suction stage 608 so as not to fall at the laser irradiation process. The suction stage 608 can be moved at a speed of about 10 mm/s or higher in X and Y axes directions on a plane parallel to the surface of the semiconductor film 607 by using an X stage 609 and a Y stage 610. By moving the suction stage 608 at appropriate speed, the whole surface of the semiconductor film 607 can be crystallized.

In this embodiment, the laser crystal is a ceramic YAG. A ceramic YAG has almost the same optical characteristic (heat conductivity, breaking strength, and absorption cross section) as a single crystal. Since ceramic can be formed into a desired shape in a short time at low cost, the crystal can have an extremely large size. Moreover, the ceramic can be doped with Nd, Yb, or the like at high concentration as compared with a single crystal. By using such a laser crystal as a medium, a laser beam with extremely high power can be emitted. Therefore, by shaping this beam with the optical system, a linear beam with a minor-axis length of 1 mm or shorter and a major-axis length of several hundred mm to several m can be obtained. In general, the panel size of a display manufactured by applying a process that uses a linear beam is restricted by the length of the linear beam. Therefore, by obtaining a longer linear beam according to the present invention, it is possible to manufacture a large display.

By doping a ceramic YAG with a plurality of kinds of dopants selected from Nd, Yb, Cr, Ti, Ho, Er, Tm, Ta, and the like, oscillation with multiple wavelengths is possible. The central wavelength of the fundamental wave of this laser ranges from 1030 to 1064 nm, and the width at half maximum of the oscillation wavelength is about 30 nm. This fundamental wave is converted into a second harmonic with a central wavelength of 515 to 532 nm and a width at half maximum of about 15 nm, by a non-linear optical crystal in the laser oscillator 601. Besides the ceramic YAG, a ceramic $Y_2O_3$ or a ceramic $YVO_4$ can be used as a laser medium to perform a laser irradiation process similarly.

When a single-wavelength laser beam passes through a slit, interference stripes appear on an irradiation surface. However, in the case of using a laser shown in this embodiment, it can be known from the following formula (3) that an interval of the interference stripes is different with respect to each wavelength. In the formula (3), "x" is an interval of the interference stripes, "d" is a width of the slit, "λ" is a wavelength, and "L" is a distance between the slit and the irradiation surface. Therefore, by using a laser beam with a wide oscillation wavelength range, the difference in the intensity of light generated by the interference can be mutually canceled, whereby the effect of the interference can be suppressed in comparison with the case of using a single-wavelength laser beam.

$$x=\lambda L/d \qquad \text{formula (3)}$$

This embodiment uses a pulsed beam whose lower limit in the repetition rate is determined so that a pulse oscillation period (repetition rate) thereof is shorter than a period after the semiconductor film 607 is melted and before the melted semiconductor film is completely solidified. For example, specifically, thp repetition rate is set to be 10 MHz or higher, which is extremely higher than normally-used repetition rate of several tens Hz to several hundred Hz.

A pulsed laser having high repetition rate is preferable because of the following reason. A period after a semiconductor film is irradiated with a laser beam and before the semiconductor film is completely solidified is said to be several tens to several hundred ns. Therefore, when a pulsed laser with low repetition rate is used, a laser beam is delivered to a semiconductor film after the semiconductor film melted by the previous laser beam is solidified, resulting in that crystal grains are formed by the respective pulsed beams and grain boundaries are formed at borders between the adjacent crystal grains. Accordingly, the surface of the semiconductor film becomes uneven.

In contrast, when a pulsed laser with high repetition rate is used, a laser beam is delivered to a semiconductor film before the semiconductor film melted by the previous laser beam is solidified. Therefore, unlike in the case of using a pulsed laser with low repetition rate, regions in a melted state are continuously formed one after another by the irradiation while moving the laser beam relative to the semiconductor film whereas regions solidified by being cooled with the time passage exist. By continuously moving an interface between a solid phase and a liquid phase in the semiconductor film, crystals grow continuously in a direction where the laser beam is moved, thereby forming crystal grains each with large grain diameter. Another feature of the pulsed laser is that peak power per pulse can be raised by increasing the repetition rate, if the energy is the same. Accordingly, the conversion efficiency of the laser beam into a second harmonic can be drastically increased. This makes it possible to easily obtain a higher harmonic with high power and to increase the productivity of this step.

By using the above method, it is possible to not only form a crystal grain grown continuously in a direction where the laser beam is moved but also suppress the formation of a microcrystal region and unevenness at borders between the adjacent regions irradiated with the laser beam. Thus, the whole surface of the semiconductor film 607 can be annealed homogeneously.

Embodiment 2

Embodiment 2 will describe an example of an optical system using a phase conjugate mirror in order to obtain a laser beam which is more suitable for annealing a semiconductor film.

When a semiconductor film is irradiated with a laser beam, a high-intensity laser beam is generally used. Therefore, when the laser beam is used for such a purpose, it is necessary to increase the peak power and to condense the laser beam so as to have high intensity. However, in the case of a high power laser, the laser medium becomes inhomogeneous because of heat, causing the distortion of the laser beam at an emission stage. Thus, it is difficult to condense the laser beam to have high intensity. Even though the phase is aligned at the emission stage, the laser beam is diffracted by passing through the slit, whereby an image to be projected to an irradiation surface is distorted. Thus, a phase conjugate mirror is used to obtain a laser beam having high intensity and aligned phase, so that the shape and intensity of the beam can be easily adjusted by using the optical system. With the thus processed laser beam, the semiconductor film can be annealed more favorably. The phase conjugate mirror has a method using a photorefractive effect, a method using stimulated Brillouin light scattering, a method using stimulated Raman scattering, a method using a Kerr effect, or the like, and any method may be employed in this embodiment.

As shown in FIG. 7 (a1), when a laser beam 701 having a plane wavefront passes through an object 702 having distortion, the wavefront changes. A reference numeral 703 denotes a wave whose wavefront is distorted. The wave 703 whose wavefront has been changed as shown in FIG. 7 (a2) is reflected on a normal mirror 704, and a reflected wave 705 passes through the object again. Then, as shown in FIG. 7 (a3), the amount of change in the wavefront of a wave 706 observed by an observer O is doubled.

FIGS. 8 (a1) to 8 (a3) show a case of using a phase conjugate mirror 710 instead of the mirror 704. In this case of using the phase conjugate mirror 710, since a phase of a reflected wave 711 is inverted, the distortion of the wavefront of the wave 711 after passing through the object 702 having distortion is mutually cancelled. Thus, a wave 712 observed by the observer O has no distortion of the wavefront (FIGS. 8 (a1) to 8 (a3)). As a result, light can travel while keeping its waveform.

Figure 9:
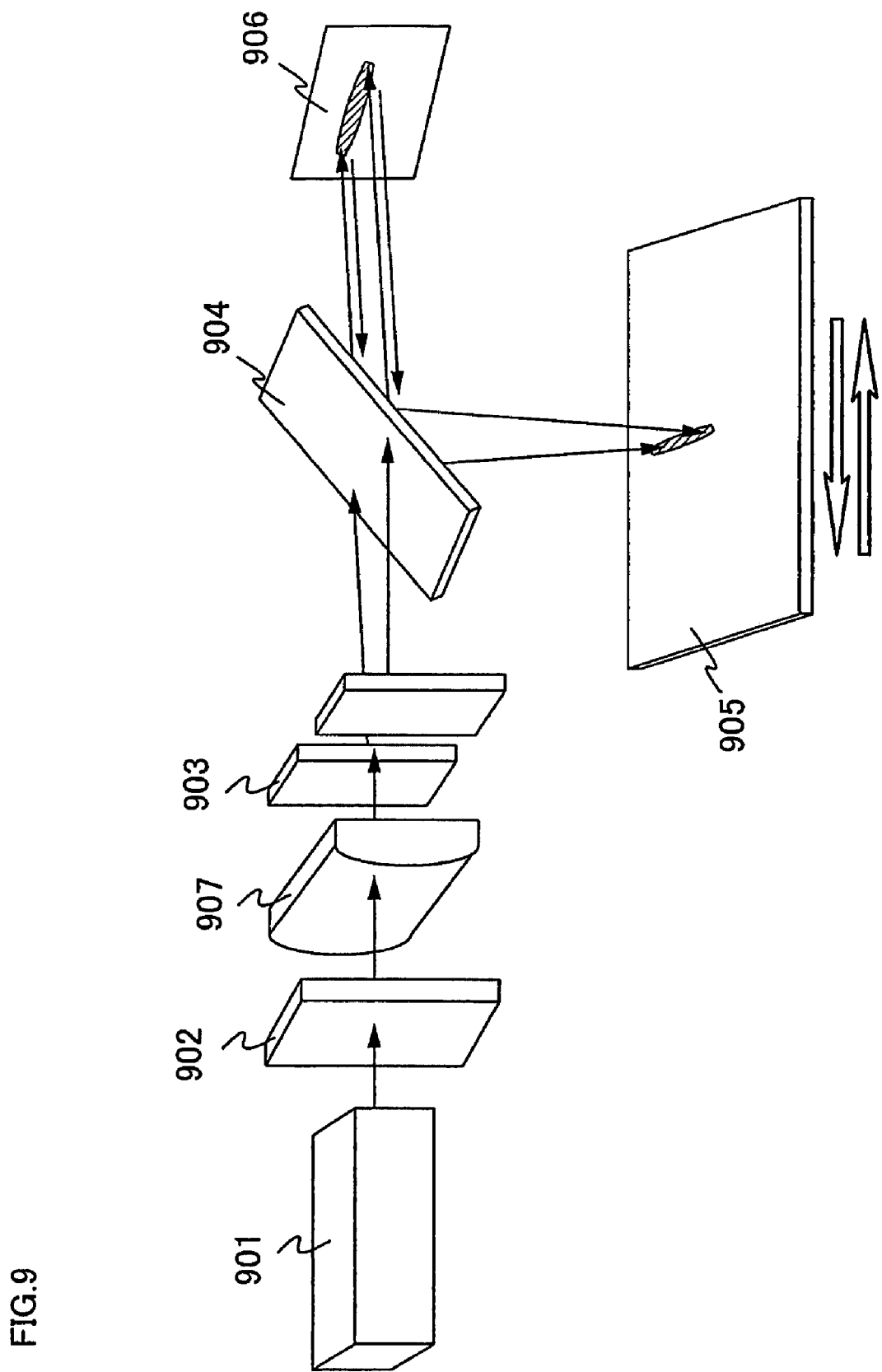
FIG. 9 shows the detail of a laser irradiation apparatus using a phase conjugate mirror.

An example of a laser irradiation apparatus using a phase conjugate mirror is shown in FIG. 9. A laser beam emitted from a laser oscillator 901 enters a diffractive optical element 902. The diffractive optical element 902 changes a cross section of the laser beam into a linear, square, or elliptical shape and also homogenizes the intensity distribution of the laser beam. The laser beam having passed through the diffractive optical element 902 forms an image on a slit 903 by a condensing lens 907.

The material, adjusting method, and the like of the slit 903 are not particularly limited as long as the slit 903 can block low-intensity regions of the laser beam at its opposite ends and, at the same time, adjust the length of the laser beam in the major-axis direction. By using the slit 903 to block the end portion of the laser beam, the intensity of the laser beam is homogenized.

After passing through the slit 903, the laser beam is divided by a beam splitter 904 into two beams, one of which enters the semiconductor film 905 and the other of which operates a phase conjugate mirror 906. In the case of using a normal mirror instead of the phase conjugate mirror 906, the beam travels while being diffracted by a distance twice as long as the distance between the slit and the mirror; therefore the image is distorted largely. However, by using the phase conjugate mirror 906, the distortion of the wavefront generated between the slit 903 and the phase conjugate mirror 906 becomes an inverse phase by conjugate reflection. Therefore, compensation of the phase is made so that the phase corresponds at the irradiation surface, which is the semiconductor film 905 here. Thus, an image of the slit 903 is formed favorably on the irradiation surface. In the case of the laser irradiation apparatus having the structure shown in FIG. 9, since a lens for extending the beam spot is not provided between the slit 903 and the semiconductor film 905, the image of the slit 903 is formed with a magnification of 1 on the semiconductor film 905.

Figure 10:
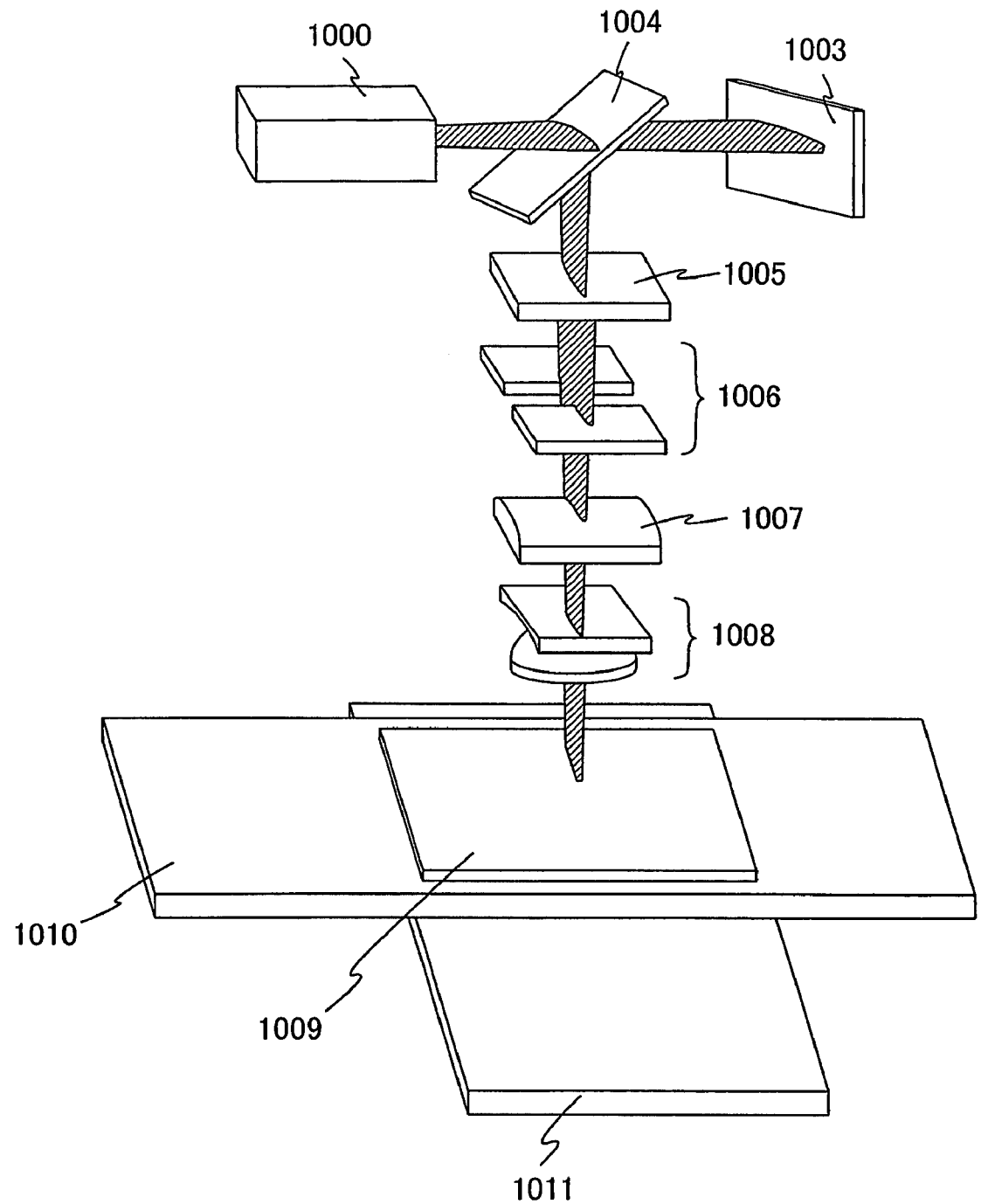
FIG. 10 shows the detail of a laser irradiation apparatus using a phase conjugate mirror.

An example of another laser irradiation apparatus is shown in FIG. 10. First, the waveform is aligned by operating a phase conjugate mirror 1003. Specifically, a laser beam emitted from a laser oscillator 1000 is divided by a beam splitter 1004 into two beams, one of which enters a diffractive optical element 1005 and the other of which operates the phase conjugate mirror 1003. By using the phase conjugate mirror 1003, the distortion of the waveform becomes an inverse phase by conjugate reflection; therefore, compensation of the phase is made so that the phase corresponds at the diffractive optical element 1005. After aligning the wavefront of the laser beam, the intensity of the laser beam is homogenized by the diffractive optical element 1005, and at the same time, the cross-sectional shape of the laser beam is changed. This is because the aligned wavefront of the laser beam makes it easy to homogenize the intensity by the diffractive optical element 1005.

Figure 11A:
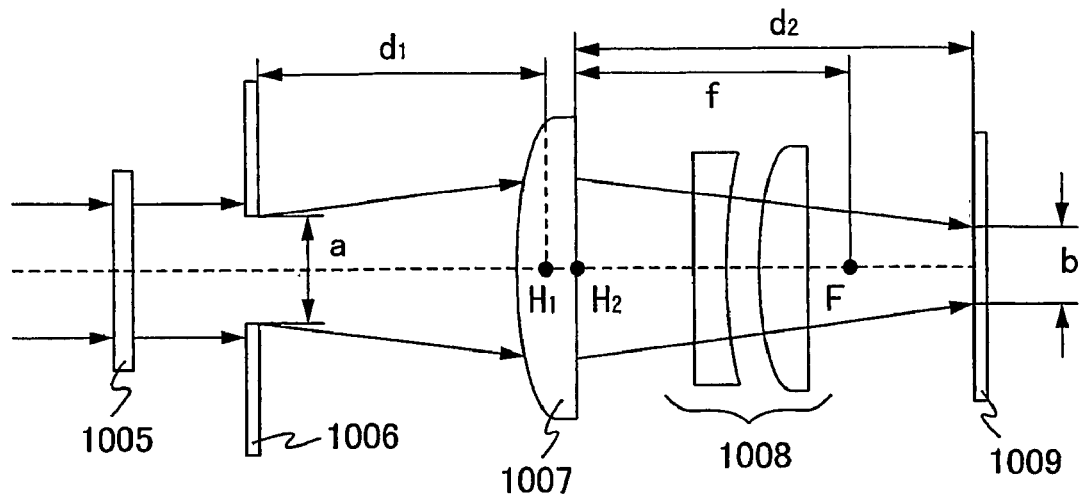
FIGS. 11A and 11B describe a positional relation of the optical system shown in FIG. 9.
Figure 11B:
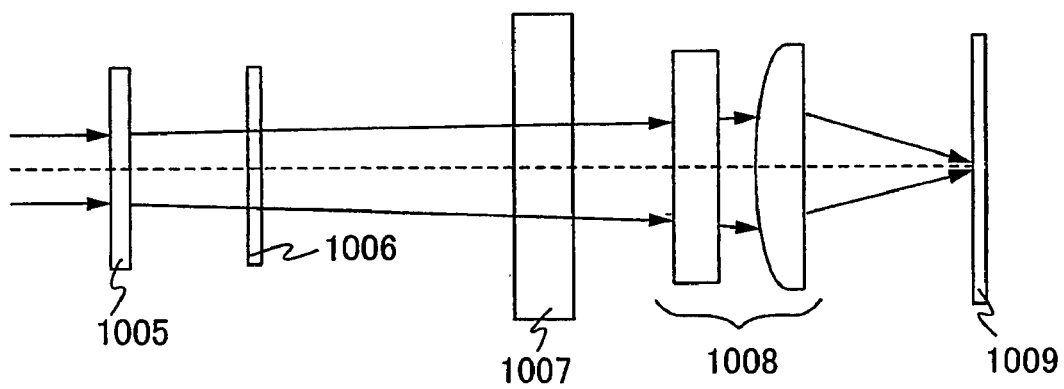

The cross section of the laser beam is changed into a linear, square, or elliptical shape by operating the diffractive optical element 1005. Next, a slit 1006 is operated. The slit 1006 blocks a low-intensity part of the laser beam so as to obtain a laser beam having intensity that is appropriate for annealing a semiconductor film. Then, as shown in FIGS. 11A and 11B, a projecting lens 1007 and a condensing lens 1008 are provided so that an image of the slit 1006 is projected to a semiconductor film 1009. A top view is shown in FIG. 11A while a side view is shown in FIG. 11B.

In FIG. 11A, the aforementioned formulas (1) and (2) are satisfied, where "a" is a width of an opening portion of the slit 1006, "b" is a length of the major axis of the laser beam on the semiconductor film 1009, "f" is a focal length of the projecting lens 1007, "$d_1$" is a distance from a rear surface of the slit 1006 to a first principal point $H_1$, and "$d_2$" is a distance from a second principal point $H_2$ of the projecting lens 1007 to the semiconductor film 1009.

The laser beam is condensed in a minor-axis direction of the laser beam. In this embodiment, a convex cylindrical lens is used as the projecting lens 1007 and a concave cylindrical lens and a convex spherical lens are used as the condensing lens 1008. In order to suppress the effect of the convex spherical lens on the major-axis direction of the laser beam, the concave cylindrical lens is provided just before the convex spherical lens so as to act in the major-axis direction of the laser beam.

A substrate over which the semiconductor film 1009 is formed is made of the insulating material shown in Embodiment 1. The substrate is fixed onto a suction stage so as not to fall at the laser irradiation process. The suction stage can be moved at a speed of about 10 mm/s or higher in an X-axis direction and a Y-axis direction on a plane parallel to the surface of the semiconductor film by using an X stage 1010 and a Y stage 1011. By moving the stage at appropriate speed, the whole surface of the semiconductor film can be crystallized.

Moreover, when a phase conjugate mirror is used inside the laser oscillator 1000, the distortion of an amplifier inside the laser oscillator 1000 can be corrected completely. This makes it possible to emit a laser beam with high intensity and aligned phase. Therefore, it becomes easier to homogenize the intensity of the beam and to shape the beam, by using the optical system.

By arranging the optical system in this way, the intensity distribution of the laser beam to be delivered can be homogenized and an intensity-insufficient part of the laser beam at its end portion can be removed. Moreover, it is possible to prevent that diffracted light generated by passing through the slit reaches the semiconductor film to cause interference stripes. With such a structure, the whole surface of the semiconductor film can be irradiated with the beam having homogeneous intensity distribution.

Embodiment 3

Embodiment 3 will describe steps of manufacturing a thin film transistor (TFT) using a laser annealing apparatus of the present invention. Although this embodiment will describe a method for manufacturing a top-gate (staggered) TFT, the present invention can be applied not only to the top-gate TFT but also to a bottom-gate (inverted staggered) TFT similarly.

Figure 12A:
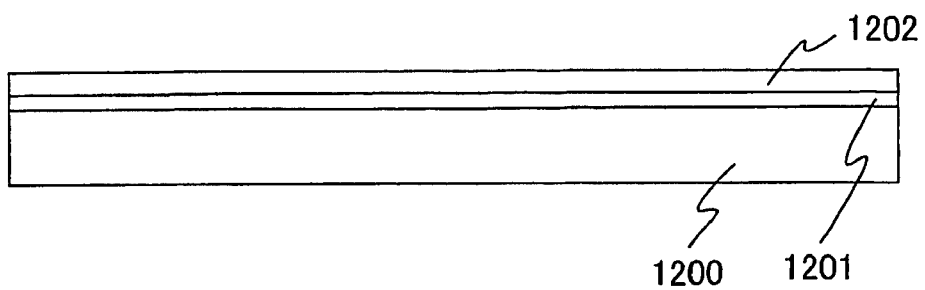
FIGS. 12A to 12D show a manufacturing process of a semiconductor element.

As shown in FIG. 12A, a base film 1201 is formed over a substrate 1200 having an insulating surface. In this embodiment, the substrate 1200 is a glass substrate. As the substrate used here, a glass substrate made of barium borosilicate glass, alumino borosilicate glass, or the like; a quartz substrate; a ceramic substrate; a stainless steel substrate; or the like can be used. Although a substrate made of a synthetic resin typified by acrylic or plastic which is represented by PET, PES, or PEN tends to have lower heat resistance than another substrate in general, the substrate can be used as long as the substrate can resist the process of this step.

The base film 1201 is provided in order to prevent the diffusion of alkaline earth metal or alkali metal such as Na from the substrate 1200 into the semiconductor Alkaline earth metal and alkali metal cause adverse effects on the characteristics of a semiconductor element when such metal is in the semiconductor film. For this reason, the base film 1201 is formed by using an insulating film which can prevent the diffusion of alkaline earth metal and alkali metal into the semiconductor, such as a silicon oxide film, a silicon nitride film, or a silicon nitride oxide film. The base film 1201 is formed either in a single-layer or multilayer structure. In this embodiment, a silicon nitride oxide film is formed in thickness from 10 to 400 nm by a plasma CVD (Chemical Vapor Deposition) method.

It is effective to provide the base film in order to prevent the diffusion of the impurity when the substrate 1200 contains even a little amount of alkaline earth metal or alkali metal, such as a glass substrate or a plastic substrate. However, when a substrate in which the diffusion of the impurity does not lead to a significant problem, for example a quartz substrate, is used, the base film 1201 is not necessarily provided.

Next, an amorphous semiconductor film 1202 is formed over the base film 1201. The amorphous semiconductor film 1202 is formed in 25 to 100 nm thick (preferably 30 to 60 nm thick) by a known method (a sputtering method, an LPCVD method, a plasma CVD method, or the like). The amorphous semiconductor film 1002 can be formed with silicon, silicon germanium, or the like. In this embodiment, silicon is used. In the case of using silicon germanium, the concentration of germanium is preferably about 0.01 to 4.5 atomic %.

Figure 12B:
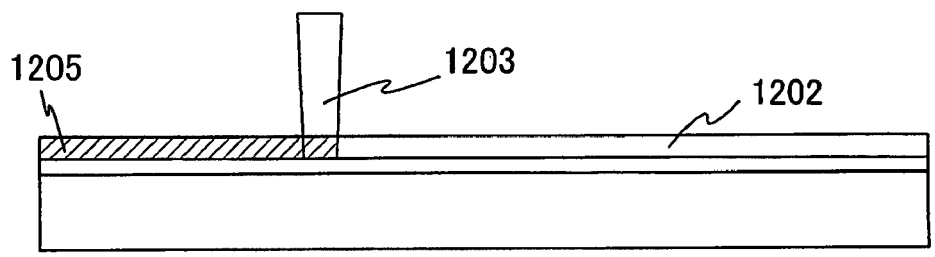

Subsequently, as shown in FIG. 12B, the amorphous semiconductor film 1202 is irradiated with a laser beam 1203 by using a laser annealing apparatus according to the present invention. In this embodiment, the laser beam 1203 is a ceramic YAG laser emitted with a repetition rate of 10 MHz or higher. By doping a laser crystal of a ceramic YAG with a plurality of kinds of dopants like Nd, Yb, or the like, oscillation with multiple wavelengths is obtained. The central wavelength of the fundamental wave of this laser ranges from 1030 to 1064 nm and the width at half maximum thereof is about 30 nm. This fundamental wave is converted into a second harmonic with a central wavelength ranging from 515 to 532 nm and a width at half maximum of about 15 nm. In this embodiment, the laser beam 1203 is converted into the second harmonic by a non-linear optical element but the laser beam may be converted into a higher harmonic other than the second harmonic.

Not only the aforementioned laser but also a CW laser or a pulsed laser with a repetition rate of 10 MHz or higher shown in another embodiments and embodiment modes can be used.

The laser beam emitted from the laser oscillator is changed into a linear, square, or elliptical shape as well as intensity distribution of the laser beam is homogenized, by a diffractive optical element. Subsequently, a low-intensity part of the beam at its end portion is blocked as well as the length of the beam in the major-axis direction is adjusted, by a slit. By using the diffractive optical element and the slit, a laser beam of which the intensity is further homogenized can be formed. Moreover, by having the laser beam pass through a convex cylindrical lens or a convex spherical lens as a projecting lens, an image of the slit can be formed directly on the amorphous semiconductor film 1202. As shown in another embodiment mode and embodiment, the amorphous semiconductor film 1202 is irradiated with the laser beam which has been condensed by the cylindrical lens or the convex spherical lens.

By the aforementioned method, it can be prevented that diffracted light generated by passing through the slit reaches the amorphous semiconductor film 1202 to form interference stripes; therefore, a laser beam with homogeneous intensity distribution can be delivered to the amorphous semiconductor film 1202. By moving this laser beam on the amorphous semiconductor film 1202, it is possible to not only form crystal grains grown continuously in a direction where the laser beam is moved but also suppress the formation of a microcrystal region and unevenness at a boundary between the adjacent regions irradiated with the laser beam. By irradiating the semiconductor film with the laser beam in this way, the whole surface of the semiconductor film can be homogeneously annealed and the characteristics of an electronic appliance manufactured using this semiconductor film can be made favorable and homogeneous.

Figure 12C:
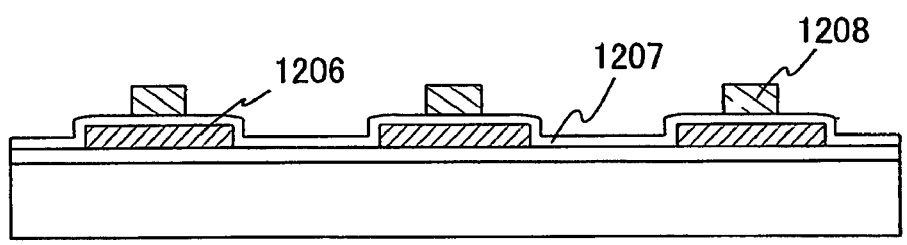

After that, as shown in FIG. 12C, a crystalline semiconductor film 1205 formed by the irradiation with the laser beam is etched to have a predetermined shape, thereby forming an island-shaped semiconductor film 1206. Moreover, a gate insulating film 1207 is formed so as to cover this island-shaped semiconductor film 1206.

The gate insulating film 1207 only needs to be an insulating film containing at least oxygen or nitrogen and may have a single layer or multilayer structure. The gate insulating film 1207 can be formed by a plasma CVD method or a sputtering method. In this embodiment, a silicon nitride oxide film ($SiN_xO_y$ (x>y, x and y=1, 2, 3 . . . )) and a silicon oxynitride film ($SiO_xN_y$ (x>y, x and y=1, 2, 3 . . . ) are continuously formed by a plasma CVD method with a total thickness of 115 nm. In the case of forming a TFT with a channel length of 1 µm or less (such a TFT is also called a submicron TFT), the gate insulating film is preferably formed with a thickness of 10 to 50 nm.

Next, a conductive film is formed over the gate insulating film 1207 and etched to have a predetermined shape, thereby forming a gate electrode 1208. This step is briefly described as follows. First, the conductive film formed over the gate insulating film 1207 may be a film having a conductive property, and a multilayer film including W (tungsten) and TaN (tantalum nitride) is used in this embodiment. However, a multilayer conductive film in which Mo (molybdenum), Al (aluminum), and Mo are sequentially stacked by using Al and Mo, or a multilayer conductive film in which Ti (titanium), Al, and Ti are sequentially stacked by using Ti and Al may be used. Moreover, an element selected from gold (Au), silver (Ag), copper (Cu), platinum (Pt), aluminum (Al), molybdenum (Mo), tungsten (W), and titanium (Ti), or an alloy or compound material containing the above element as its main component may be used. Furthermore, these materials may be stacked.

Then, a resist mask for patterning this conductive film is formed. First, a photoresist is applied by a spin coating method or the like over the conductive film and then light exposure is carried out. Next, a heat treatment (prebake) is conducted to the photoresist. The prebake is carried out at 50 to 120° C., which is lower than the temperature at postbake to be conducted later. In this embodiment, the prebake is carried out at 90° C. for 90 seconds.

Subsequently, the light-exposed resist is developed by dropping a liquid developer or spraying a liquid developer from a spray nozzle onto the photoresist.

After that, a heat treatment, i.e., the postbake is carried out at 125° C. for 180 seconds to the developed photoresist. Thus, moisture and the like remaining in the resist mask are removed and at the same time, the stability against heat is increased. The resist mask is formed according to these steps. Based on the resist mask, the conductive film is etched into a predetermined shape to form the gate electrode 1208.

As another method, the gate electrode 1208 may be formed directly over the gate insulating film 1207 by a printing method capable of discharging a material at a predetermined location or a droplet discharging method typified by an ink jet method.

As the material to be discharged, a conductive material which is dissolved or dispersed in a solvent is used. As the material of the conductive film, at least one kind selected from gold (Au), silver (Ag), copper (Cu), platinum (Pt), aluminum (Al), chromium (Cr), palladium (Pd), indium (In), molybdenum (Mo), nickel (Ni), lead (Pb), iridium (Ir), rhodium (Rh), tungsten (W), cadmium (Cd), zinc (Zn), iron (Ir), titanium (Ti), zirconium (Zr), barium (Ba), and the like or alloy containing any of these elements is used. The solvent may be any selected from esters such as butyl acetate and ethyl acetate, alcohols such as isopropyl alcohol and ethyl alcohol, an organic solvent such as methyl ethyl ketone and acetone, and the like.

The viscosity of the composition is set to be 0.3 Pa·s or less. This is to prevent the composition from being dried and to facilitate the discharging of the composition from a nozzle. The viscosity and surface tension of the composition may be appropriately adjusted in accordance with the solvent to be used and the intended purpose.

Then, the gate electrode 1208 or the resist used when the gate electrode 1208 is formed is used as the mask to selectively add impurities imparting n-type or p-type conductivity into the island-shaped semiconductor film 1206. Thus, a source region 1209, a drain region 1210, an LDD region 1211, and the like are formed. By the above steps, N-channel TFTs 1212 and 1213, and a P-channel TFT 1214 are formed over one substrate (see FIG. 12D).

Figure 12D:
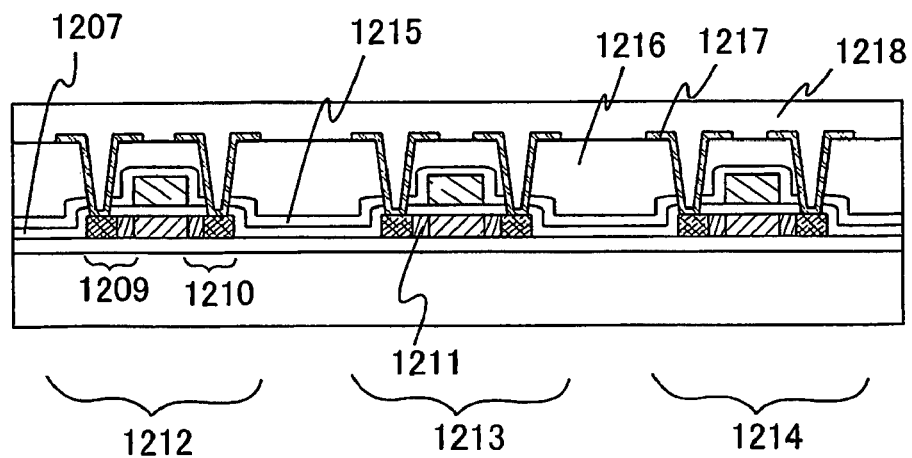

Subsequently, as shown in FIG. 12D, an insulating film 1215 is formed to protect these TFTs. This insulating film 1215 is formed in thickness of 100 to 200 nm by a plasma CVD method or a sputtering method with a silicon nitride film or a silicon nitride oxide film in a single-layer or multilayer structure. In the case of combining a silicon nitride oxide film and a silicon oxynitride film, these films can be continuously formed by switching gas. In this embodiment, a silicon oxynitride film with a thickness of 100 nm is formed by a plasma CVD method. By providing the insulating film 1215, it is possible to obtain a blocking effect to prevent the intrusion of ionic impurities in addition to oxygen and moisture in the air.

Subsequently, an insulating film 1216 is formed. Here, the insulating film 1216 can be formed by using an organic resin film including polyimide, polyamide, BCB (benzocyclobutene), acrylic, siloxane, or the like, which is applied by an SOG (Spin On Glass) method or a spin coating method. Moreover, an inorganic interlayer insulating film (an insulating film containing silicon, such as a silicon nitride film or a silicon oxide film), a low-k (low dielectric) material, or the like can also be used. Since the insulating film 1216 is formed with a main purpose for relaxing unevenness due to TFTs formed over the glass substrate to make the insulating film 1216 flat, a film superior in flatness is preferable. It is to be noted that siloxane is a material whose skeletal structure includes a bond of silicon (Si) and oxygen (O) and whose substituent is an organic group including at least hydrogen (such as an alkyl group or aromatic hydrocarbon) or a fluoro group. As the substituent, both of an organic group including at least hydrogen and a fluoro group may be included.

Moreover, the gate insulating film 1207, the insulating film 1215, and the insulating film 1216 are patterned by a photolithography method, thereby forming contact holes that reach the source region 1209 and the drain region 1210.

Next, a conductive film is formed with a conductive material and patterned, thereby forming a wire 1217. After that, an insulating film 1218 is formed as a protective film. Thus, a semiconductor device shown in FIG. 12D is completed.

The method for manufacturing a semiconductor device by using a laser annealing method of the present invention is not limited to the aforementioned manufacturing steps of a TFT. By using the semiconductor film crystallized by the laser irradiation method of the present invention as an active layer of a TFT, the variation in mobility, threshold, and on current between the elements can be suppressed.

Moreover, a crystallization step using a catalytic element may be provided prior to the crystallization by the laser beam. As the catalytic element, nickel (Ni), germanium (Ge), iron (Fe), palladium (Pd), tin (Sn), lead (Pb), cobalt (Co), platinum (Pt), copper (Cu), gold (Au), or the like can be used.

The laser irradiation may be carried out after adding the catalytic element to promote the crystallization through a heat treatment or the heat treatment may be omitted. Alternatively, after the heat treatment, a laser process may be carried out while keeping the temperature.

Although this embodiment has shown the example of using the laser irradiation method of the present invention to crystallize the semiconductor film, the laser irradiation method of the present invention may be carried put to activate the impurity elements added in the semiconductor film. Moreover, the method for manufacturing a semiconductor device according to the present invention can be applied to a method for manufacturing an integrated circuit or a semiconductor display device.

According to the present invention, the semiconductor film can be annealed homogeneously. Therefore, if TFTs are manufactured using the semiconductor film by the method according to the present invention, all the TFTs have favorable characteristics and the characteristics of the respective TFTs are uniform.

This embodiment can be freely combined with any of the above embodiment modes and embodiments.

Embodiment 4

Embodiment 4 will describe an example for carrying out crystallization more favorably by combining a crystallization method using a laser irradiation apparatus of the present invention with a crystallization method by a catalytic element.

Figure 13A:
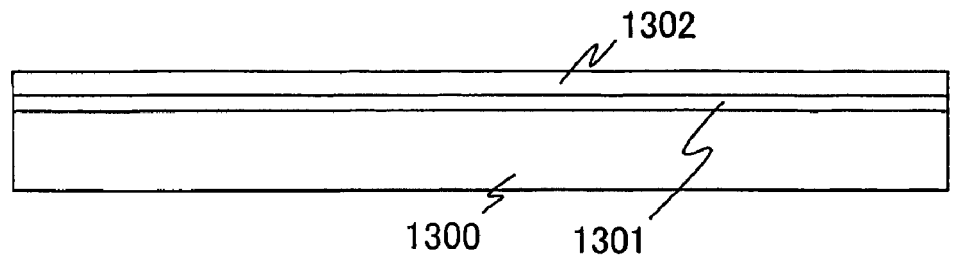
FIGS. 13A to 13D show a manufacturing method of a crystalline semiconductor film.
Figure 13B:
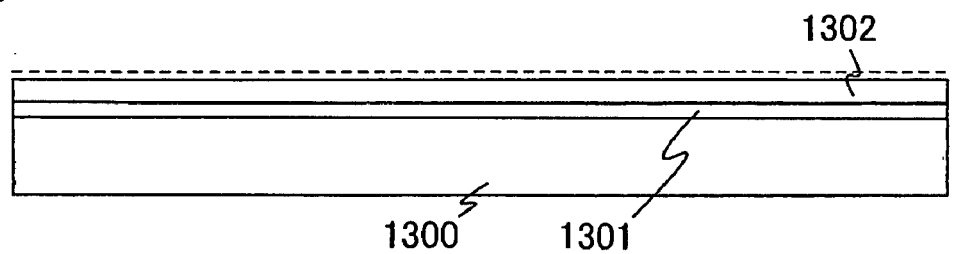

First, as shown in FIG. 13A, the steps up to forming a base film 1301 over a substrate 1300 and forming a semiconductor film 1302 over the base film 1301 are carried out with reference to Embodiment 2. Next, as shown in FIG. 13B, a solution containing Ni by 10 to 100 ppm in weight, for example, a nickel acetate solution is applied by a spin coating method to a surface of the semiconductor film 1302, whereby a region where nickel is introduced is formed in the vicinity of the surface of the semiconductor film 1302. A dotted line in FIG. 13B indicates that the catalytic element has been introduced. The introduction of the catalytic element may be carried out not only by the above method but also by a sputtering method, an evaporation method, a plasma process, or the like.

Figure 13C:
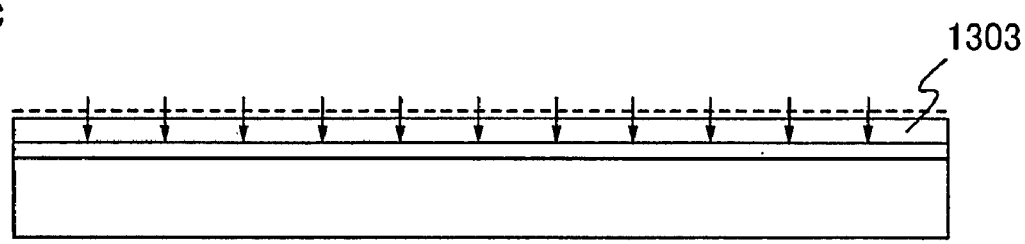

Then, a heat treatment is conducted at 500 to 650° C. for 4 to 24 hours, for example, at 500° C. for 14 hours. By this heat treatment, crystallization is promoted in a perpendicular direction from the region where the catalytic element has been introduced toward a region where the catalytic element is not introduced, i.e., from the surface of the semiconductor film toward the substrate 1300, as indicated by an arrow. Thus, a crystallized semiconductor film 1303 is formed (see FIG. 13C).

The heat treatment may be performed by RTA (rapid thermal anneal) at a set heat temperature of 740° C. for 180 seconds, in accordance with RTA using lamp radiation as a heat source or RTA using heated gas (gas RTA). The set heat temperature here is the temperature of the substrate measured by a pyrometer, and the temperature is regarded as the set temperature at the heat treatment. In addition, a heat treatment at 550° C. for 4 hours using an annealing furnace is given. It is the action of the metal element having a catalytic action that decreases the temperature and time at the crystallization.

Although nickel (Ni) is used as the catalytic element: in this embodiment, germanium (Ge), iron (Fe), palladium (Pd), tin (Sn), lead (Pb), cobalt (Co), platinum (Pt), copper (Cu), gold (Au), or the like may be used.

Figure 13D:
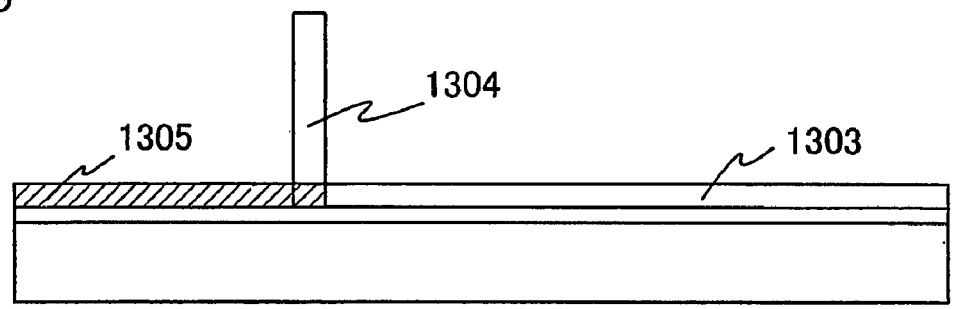

Next, as shown in FIG. 13D, the semiconductor film 1303 is crystallized by using a laser irradiation apparatus. This embodiment uses a Ti:sapphire laser. The TI:sapphire laser is a laser capable of oscillating multiple wavelengths with one kind of dopant. A laser beam 1304 has a fundamental wave with a central wavelength ranging from 660 to 1180 nm. This fundamental wave is converted into a second harmonic with a central wavelength of 330 to 540 nm by a non-linear optical crystal inside the laser oscillator and the second harmonic is emitted with a repetition rate of 10 MHz or higher. In this embodiment, although the second harmonic is used, a higher harmonic other than the second harmonic may also be used.

As the laser oscillator, the CW laser or pulsed laser with a repetition rate of 10 MHz or higher shown in the above embodiment modes and embodiments can also be used.

After the intensity distribution of the laser beam 1304 emitted from the laser oscillator is homogenized by a diffractive optical element, a low-intensity portion at the end of the beam is blocked. Moreover, a convex cylindrical lens serving as a projecting lens is provided so as to act in the major-axis direction of the laser beam 1304, thereby projecting an image of the slit directly onto the semiconductor film. In this way, the laser beam 1304 of which the intensity at the cross section is homogenized can be delivered to the semiconductor film.

By carrying out the laser irradiation method described above, it is possible to not only form crystal grains grown continuously in a direction where the laser beam is moved but also suppress the formation of a microcrystal region and unevenness at borders between the adjacent laser irradiation regions.

With the irradiation of the semiconductor film 1303 with the laser beam 1304, a semiconductor film 1305 whose crystallinity has been further enhanced is formed. It is considered that the semiconductor film 1305 that is crystallized by using a catalytic element includes the catalytic element (herein nickel) at a concentration of about $1 \times 10^{19}$ atoms/cm$^3$. Next, the catalytic element existing in the semiconductor film 1305 is gettered. By the gettering, the metal element mixed in the semiconductor film can be removed, whereby off current can be decreased.

Figure 14A:
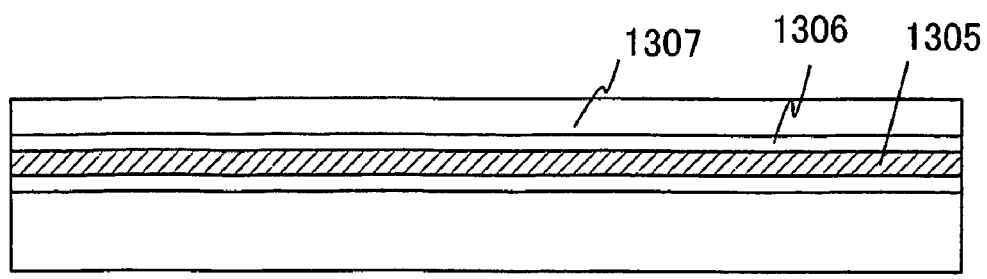
FIGS. 14A to 14C show a manufacturing method of a crystalline semiconductor film.

First, an oxide film 1306 is formed on a surface of the semiconductor film 1305 as shown in FIG. 14A. By forming the oxide film 1306 with a thickness of about 1 to 10 nm, it is possible to prevent the surface of the semiconductor film 1305 from becoming rough in a later etching step. The oxide film 1306 can be formed by a known method. For example, the oxide film 1306 can be formed by oxidizing the surface of the semiconductor film 1305 with the use of ozone water; a water solution in which a hydrogen peroxide solution is mixed with sulfuric acid, hydrochloric acid, nitric acid; or the like or may be formed by a plasma treatment, heat treatment, or ultraviolet irradiation in an atmosphere containing oxygen. The oxide film may be separately formed by a plasma CVD method, a sputtering method, an evaporation method, or the like.

Subsequently, over the oxide film 1306, a semiconductor film 1307 for the gettering that contains a noble gas element at a concentration of about $1 \times 10^{20}$ atoms/cm$^3$ or more is formed in thickness from 25 to 250 nm by a sputtering method. The semiconductor film 1307 for the gettering desirably has low film density than the semiconductor film 1305 in order to increase the selective ratio of the etching with respect to the semiconductor film 1305. As the noble gas element, one or more kinds selected from helium (He), neon (Ne), argon (Ar), krypton (Kr), and xenon (Xe) is/are used.

Figure 14B:
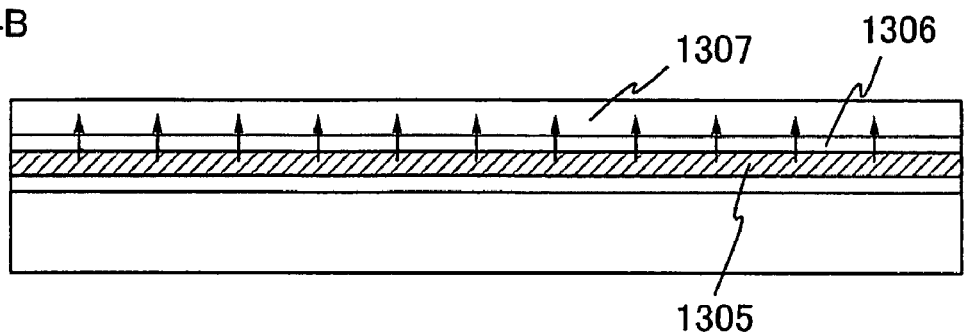

Next, as shown in FIG. 14B, a heat treatment is conducted according to a furnace annealing method or an RTA method, thereby carrying out gettering. In the case of the furnace annealing method, the heat treatment is conducted at 450 to 600° C. for 0.5 to 12 hours in a nitrogen atmosphere. In the case of using an RTA method, a lamp light source for the heating is turned on for 1 to 60 seconds, preferably 30 to 60 seconds, which is repeated by 1 to 10 times, preferably 2 to 6 times. The lamp light source may have any light intensity as long as the semiconductor film can be heated instantaneously at about 600 to 1000° C., preferably about 700 to 750° C.

By the heat treatment, the catalytic element in the semiconductor film 1305 moves to the semiconductor film 1307 for the gettering by dispersion as indicated by an arrow and is gettered.

Subsequently, the semiconductor film 1307 for the gettering is selectively etched away. The etching can be carried out by dry etching with $ClF_3$ that does not apply plasma or wet etching with an alkali solution such as a water solution including hydrazine or tetramethylammonium hydroxide $((CH_3)_4NOH)$. At this time, the oxide film 1306 can prevent the semiconductor film 1305 from being etched.

Figure 14C:
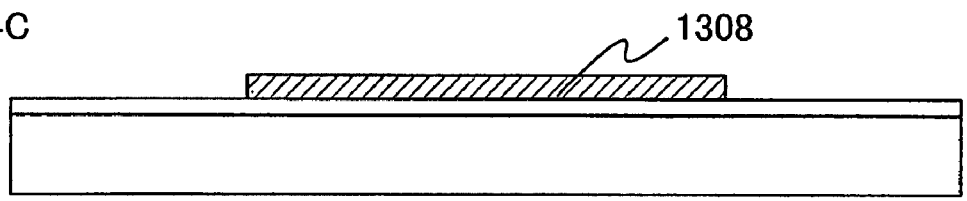

Next, after removing the oxide film 1306 with fluorinated acid, the semiconductor film 1305 is etched into a predetermined shape, thereby forming an island-shaped semiconductor film 1308 (FIG. 14C). By using the island-shaped semiconductor film 1308, various semiconductor elements typified by a TFT can be formed. In this embodiment, the gettering step is not limited to the method shown in this embodiment. Another method may be also used to decrease the concentration of the catalytic element in the semiconductor film.

This embodiment has shown the structure in which the crystallization is performed in such a way that the heat treatment is performed after the catalyst element is added in order to promote the crystallization and that the laser irradiation is performed in order to enhance the crystallinity further. The present invention is not limited to this, and the heat treatment may be omitted. Specifically, after adding the catalyst element, the semiconductor film may be irradiated with the laser beam instead of the heat treatment so as to enhance the crystallinity.

This embodiment can be freely combined with another embodiment modes and embodiments.

Embodiment 5

TFTs manufactured in accordance with the present invention can be used for a thin film integrated circuit device or a contactless thin film integrated circuit device (also referred to as a wireless IC tag or an RFID (Radio Frequency Identification) tag). By applying the manufacturing method shown in another embodiment, the thin film integrated circuit device and the contactless thin film integrated circuit device can be used as a tag or a memory.

By applying the present invention, a laser irradiation process can be conducted to the whole surface of the semiconductor film favorably. Therefore, the degree of freedom of the layout and size of the semiconductor element and the degree of integration can be increased. Further, the product quality of the manufactured thin film integrated circuit device and contactless thin film integrated circuit device is in a favorable condition and the variation in quality can be suppressed. The specific examples are described with reference to the drawings.

This embodiment shows an example of using electrically-isolated TFTs as semiconductor elements used in an integrated circuit of a wireless IC tag. However, the semiconductor element applicable to the integrated circuit of the wireless IC tag is not limited to the TFT but any element is applicable. For example, a storage element, a diode, a photoelectric conversion element, a resistance element, a coil, a capacitor element, an inductor, and the like are typically given.

Figure 15A:
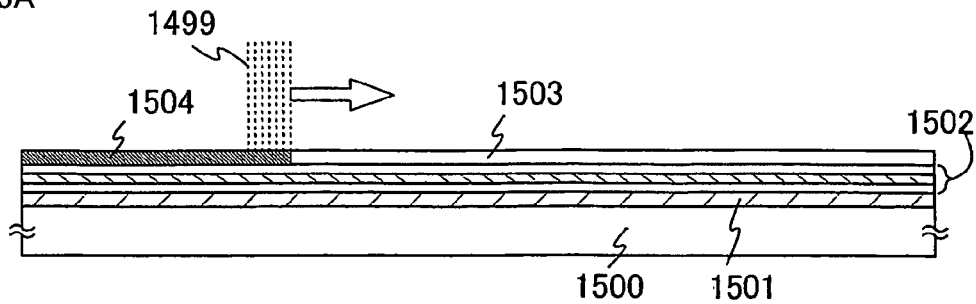
FIGS. 15A to 15E show a manufacturing process of a semiconductor device.

First, a peeling layer 1501 is formed over a first substrate 1500 made of glass by a sputtering method as shown in FIG. 15A. The peeling layer 1501 can be formed by a sputtering method, a low-pressure CVD method, a plasma CVD method, or the like. In this embodiment, the peeling layer 1501 is formed with amorphous silicon in approximately 50 nm thick by a low-pressure CVD method. The material of the peeling layer 1501 is not limited to silicon and a material which can be selectively etched away (such as W or Mo) may be used. The thickness of the peeling layer 1501 desirably ranges from 50 to 60 nm.

Next, a base insulating film 1502 is formed over the peeling layer 1501. The base insulating film 1502 is provided so as to prevent alkaline earth metal or alkali metal such as Na included in the first substrate from diffusing to the semiconductor film. Alkali metal and alkaline earth metal cause adverse effects on the characteristic of a semiconductor element such as a TFT when the metal is in the semiconductor film. Moreover, the base insulating film 1502 also has a function to protect the semiconductor element in a later step of peeling the semiconductor element. The base insulating film 1502 can be formed with a single insulating film or a plurality of insulating films that are stacked. Therefore, an insulating film which can suppress the diffusion of alkali metal and alkaline earth metal into the semiconductor, such as a silicon oxide film, a silicon nitride film, a silicon oxide film containing nitrogen (SiON), or a silicon nitride film containing oxygen (SiNO) is used.

Next, a semiconductor film 1503 is formed over the base insulating film 1502. The semiconductor film 1503 is desirably formed without being exposed to the air after the base insulating film 1502 is formed. The thickness of the semiconductor film 1503 is set in the range of 20 to 200 nm (desirably 40 to 170 nm, more desirably 50 to 150 nm).

Similarly to other embodiment modes and embodiments, the semiconductor film 1503 is irradiated with a laser beam 1499 to crystallize the semiconductor film 1503. By irradiating the semiconductor film 1503 with the laser beam 1499, a crystalline semiconductor film 1504 is formed. FIG. 15A is a cross-sectional view showing the state that the scan with the laser beam 1499 has been partway carried out.

By applying the present invention, a laser beam with homogeneous intensity can be obtained without causing laser interference stripes to appear on an irradiation surface. By using this laser beam, a laser process can be carried out homogeneously to the semiconductor film.

Figure 15B:
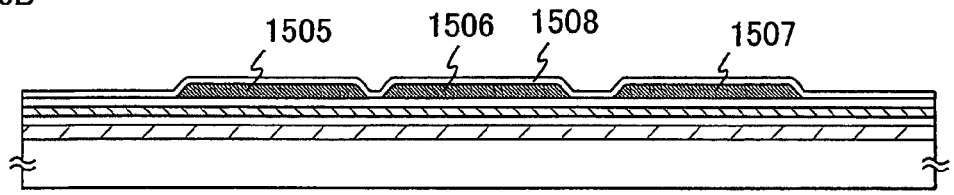

Next, as shown in FIG. 15B, the semiconductor film 1504 having a crystal structure is etched into a predetermined shape, thereby forming island-shaped semiconductor films 1505 to 1507. Then, a gate insulating film 1508 is formed. The gate insulating film 1508 is formed with silicon nitride, silicon oxide, silicon oxide containing nitrogen, or silicon nitride containing oxygen in a single-layer or multilayer structure by a plasma CVD method, a sputtering method, or the like.

After forming the gate insulating film 1508, a heat treatment may be performed at 300 to 450° C. for 1 to 12 hours in an atmosphere containing 3 to 100% of hydrogen to hydrogenate the island-shaped semiconductor films 1505 to 1507. As another means for the hydrogenation, plasma hydrogenation (using hydrogen excited in plasma) may be performed.

Figure 15C:
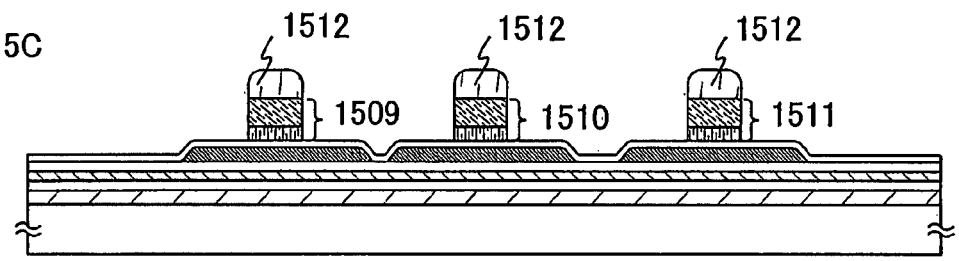

Next, as shown in FIG. 15C, gate electrodes 1509 to 1511 are formed. Here, after stacking Si and W by a sputtering method, etching is carried out with a resist 1512 as a mask to form the gate electrodes 1509 to 1511. Needless to say, conductive materials, structures, and manufacturing methods of the gate electrodes 1509 to 1511 are not limited to these, and they can be selected appropriately. For example, a multilayer structure including Si and NiSi (nickel silicide) doped with impurities imparting n-type conductivity or a multilayer structure including TaN (tantalum nitride) and W (tungsten) is applicable. Moreover, a single layer formed with various conductive materials may also be used. In the case of forming the gate electrode and the antenna at the same time, the material may be selected in consideration of these functions.

A mask of SiOX or the like may be used instead of the resist mask. In this case, the step of forming and etching SiOX, SiON, or the like into a predetermined shape to form a mask (called a hard mask) is added; however, since the film decrease in the hard mask at the etching is less than that in the resist mask, the gate electrodes 1509 to 1511 can have desired widths. The gate electrodes 1509 to 1511 may be selectively formed by a droplet discharging method.

Figure 15D:
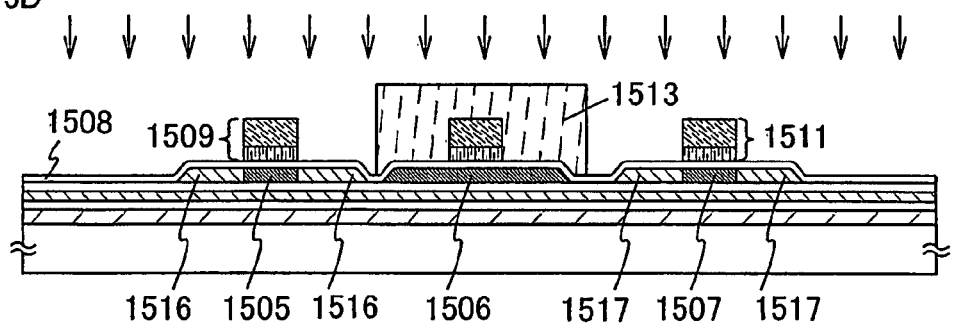

Subsequently, as shown in FIG. 15D, the island-shaped semiconductor film 1506 to become a p-channel TFT is covered with a resist 1513, and the island-shaped semiconductor films 1505 and 1507 are lightly doped with an impurity element imparting n-type conductivity (typically P (phosphorus) or As (arsenic)). This doping step is conducted through the gate insulating film 1508, whereby a pair of low-concentration impurity regions 1516 and 1517 is formed in the island-shaped semiconductor films 1505 and 1507. This doping step may be carried out without covering with the resist 1513 the island-shaped semiconductor film 1506 to become a P-channel TFT.

Figure 15E:
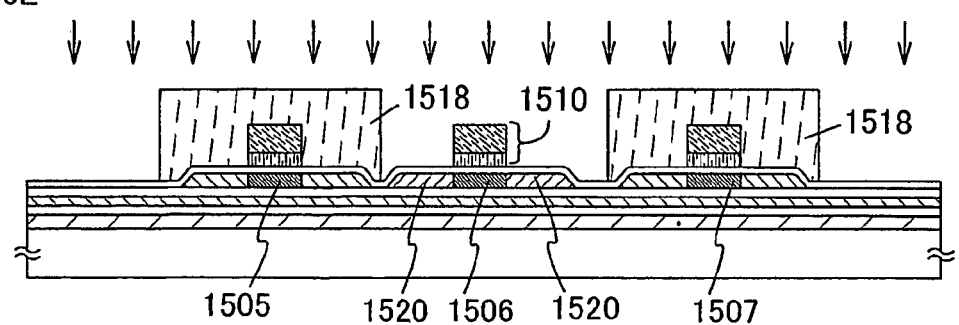

Subsequently, as shown in FIG. 15E, after removing the resist 1513 by ashing or the like, a resist 1518 is newly formed so as to cover the island-shaped semiconductor films 1505 and 1507 to become N-channel TFTs. Then, the island-shaped semiconductor film 1506 is heavily doped with an impurity element imparting P-type conductivity (typically B (boron)) by using the gate electrode 1510 as a mask. This doping step is carried out through the gate insulating film 1508, thereby forming a pair of P-type high-concentration impurity regions 1520 in the island-shaped semiconductor film 1506.

Figure 16A:
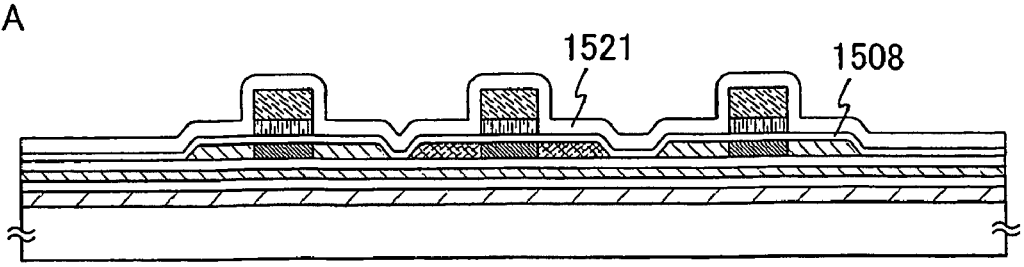
FIGS. 16A to 16C show a manufacturing process of a semiconductor device.

Then, after removing the resist 1518 by ashing or the like, an insulating film 1521 is formed so as to cover the gate insulating film 1508 and the gate electrodes 1509 to 1511 as shown in FIG. 16A.

Figure 16B:
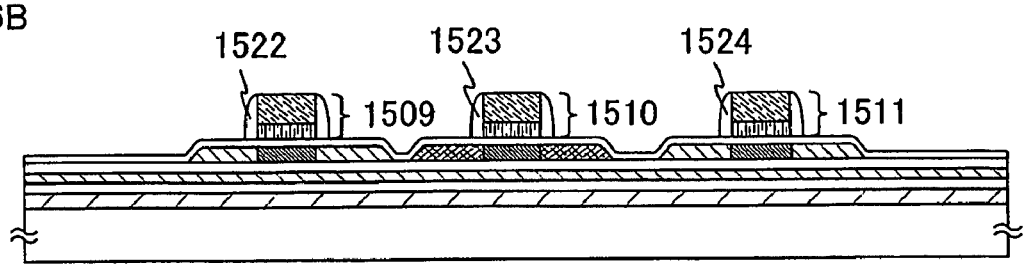

After that, the insulating film 1521 and the gate insulating film 1508 are partially etched by an etch back method, whereby sidewalls 1522 to 1524 are formed in a self-aligning manner in contact with side walls of the gate electrodes 1509 to 1512 as shown in FIG. 16B. As the etching gas, a mixed gas of $CHF_3$ and He is used. However, the step of forming the sidewall is not limited to this.

Figure 16C:
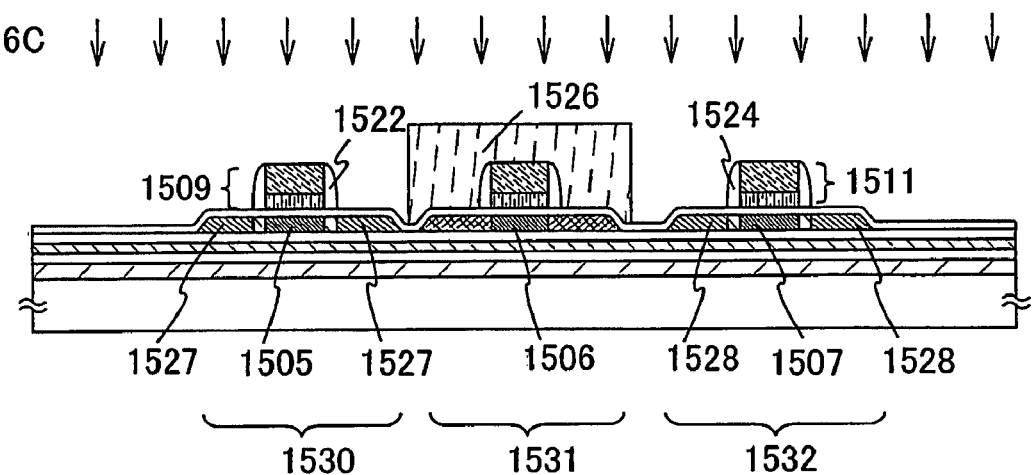

Subsequently, as shown in FIG. 16C, a resist 1526 is newly formed so as to cover the island-shaped semiconductor film 1506 to be a P-channel TFT. Then, the island-shaped semiconductor films 1505 and 1507 are heavily doped with an impurity element imparting n-type conductivity (typically P or As) by using the gate electrodes 1509 and 1511 and the sidewalls 1522 and 1524 as masks. This doping step is carried out through the gate insulating film 1508, whereby a pair of n-type high-concentration impurity regions 1527 and 1528 is formed in the island-shaped semiconductor films 1505 to 1507.

Next, after removing the resist 1526 by ashing or the like, the impurity regions may be thermally activated. For example, after forming a 50-nm-thick SiON film, a heat treatment may be conducted at 550° C. for 4 hours in a nitrogen atmosphere. Moreover, a defect in the polycrystalline semiconductor film can be improved by forming a $SiN_x$ film containing hydrogen in a thickness of 100 nm and then carrying out a heat treatment at 410° C. for 1 hour in a nitrogen atmosphere. This is to terminate dangling bonds in the polycrystalline semiconductor film and referred to as a hydrogenation process step or the like.

According to the aforementioned steps, an N-channel TFT 1530, a P-channel TFT 1531, and an N-channel TFT 1532 are formed. In this manufacturing step, a TFT with a channel length of 0.2 to 2 μm can be formed by appropriately changing the condition in the etch back method to adjust the size of the sidewall.

Moreover, thereafter, a passivation film to protect the N-channel TFTs 1530 and 1532 and the P-channel TFT 1531 may be formed.

Figure 17A:
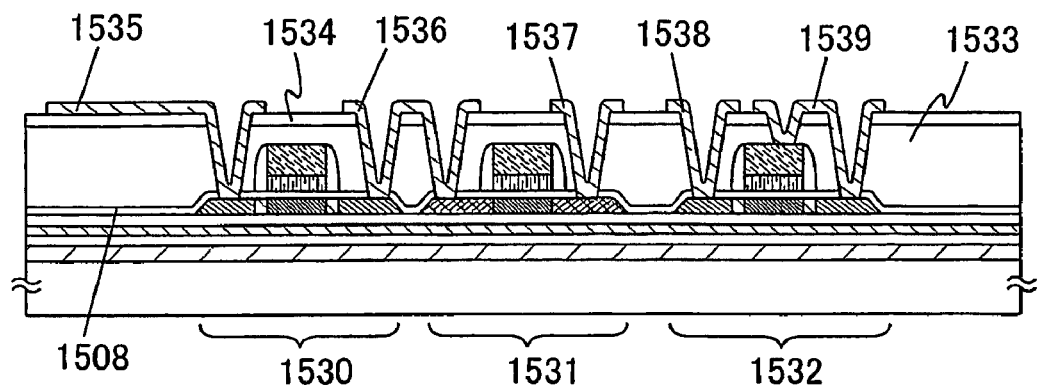
FIGS. 17A and 17B show a manufacturing process of a semiconductor device.

Subsequently, as shown in FIG. 17A, a first interlayer insulating film 1533 is formed so as to cover the N-channel TFTs 1530 and 1532 and the P-channel TFT 1531.

Moreover, a second interlayer insulating film 1534 is formed over the first interlayer insulating film 1533. A filler may be mixed into the first interlayer insulating film 1533 or the second interlayer insulating film 1534 in order to prevent the first interlayer insulating film 1533 or the second interlayer insulating film 1534 from being peeled or cracked due to stress caused by a difference of coefficient of thermal expansion between the first interlayer insulating film 1533 or the second interlayer insulating film 1534 and a conductive material and the like for forming wiring later.

Next, as shown in FIG. 17A, contact holes are formed in the first interlayer insulating film 1533, the second interlayer insulating film 1534, and the gate insulating film 1508, and then wires 1535 to 1539 to be connected to the N-channel TFTs 1530 and 1532 and the P-channel TFT 1531 are formed. The wires 1535 and 1536 are connected to the high-concentration impurity region 1527 of the N-channel TFT 1530, the wires 1536 and 1537 are connected to the high-concentration impurity region 1520 of the P-channel TFT 1531, and the wires 1538 and 1539 are connected to the high-concentration impurity region 1528 of the N-channel TFT 1532, respectively. The wire 1539 is also connected to the gate electrode 1511 of the N-channel TFT 1532. The N-channel TFT 1532 can be used as a memory element of a random ROM.

Figure 17B:
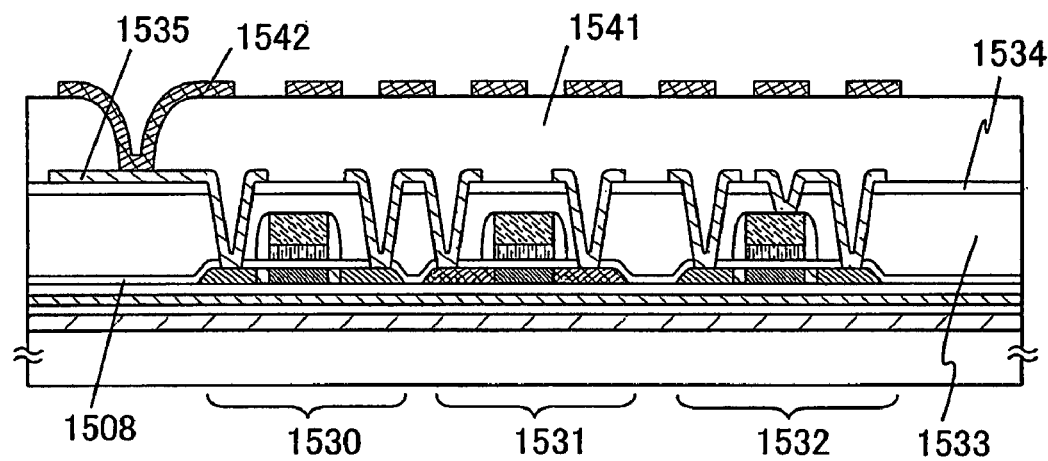

Next, as shown in FIG. 17B, a third interlayer insulating film 1541 is formed over the second interlayer insulating film 1534 so as to cover the wires 1535 to 1539. The third interlayer insulating film 1541 is formed so as to have an opening portion at a position where the wire 1535 is partially exposed. The third interlayer insulating film 1541 can be formed with a similar material to the first interlayer insulating film 1533.

Next, an antenna 1542 is formed over the third interlayer insulating film 1541. The antenna 1542 is formed with a conductive material including one or more of the following metal or one or more of metal compounds containing the following metal: Ag, Au, Cu, Pd, Cr, Mo, Ti, Ta, W, Al, Fe, Co, Zn, Sn, Ni, or the like. The antenna 1542 is connected to the wire 1535. In FIG. 17B, the antenna 1542 is directly connected to the wire 1535; however, the wireless IC tag of the present invention is not limited to this structure. For example, by using a separately-formed wire, the antenna 1542 may be electrically connected to the wire 1535.

The antenna 1542 can be formed by a photolithography method, an evaporation method, a droplet discharging method, or the like. In FIG. 17B, the antenna 1542 is formed with a single conductive film; however, the antenna 1542 can be formed by stacking a plurality of conductive films. For example, the antenna 1542 may be formed by coating a Ni wire or the like with Cu by electroless plating.

The droplet discharging method is a method in which a predetermined pattern is formed by discharging a droplet containing a predetermined composition from a small nozzle, and includes an ink-jet method and the like in its category. The printing method includes a screen printing method, an off-set printing method, and the like. By using a printing method or a droplet discharging method, the antenna 1542 can be formed without using a mask for light-exposure. Moreover, a droplet discharging method and a printing method do not waste materials which are to be etched away in a photolithography method. Since an expensive mask for light-exposure is not necessary, the cost spent on the manufacturing of wireless IC tags can be suppressed.

In the case of using a droplet discharging method or various printing methods, for example, a conductive particle like Cu coated with Ag can also be used. If the antenna 1542 is formed by a droplet discharging method, it is desirable to perform a treatment for enhancing the adhesiveness of the antenna 1542 to the surface of the third interlayer insulating film 1541.

As a method for enhancing the adhesiveness, specifically, a method in which metal or a metal compound which can enhance the adhesiveness of a conductive film or an insulating film by a catalytic action is attached to the surface of the third interlayer insulating film 1541, a method in which an organic insulating film, metal, or a metal compound which has high adhesiveness with respect to a conductive film or an insulating film to be formed is attached to the surface of the third interlayer insulating film 1541, a method in which surface modification is carried out through a plasma treatment to the surface of the third interlayer insulating film 1541 under atmospheric pressure or low pressure.

If the metal or the metal compound to be attached to the third interlayer insulating film 1541 has a conductive property, sheet resistance thereof is controlled so that normal operation of the antenna is not interrupted. Specifically, the average thickness of the metal or the metal compound having a conductive property may be controlled so as to range from, for example, 1 to 10 nm, or the metal or the metal compound may be insulated wholly or partially by oxidation. Alternatively, the attached metal or metal compound may be selectively etched away except for a region where the adhesiveness is to be increased. Moreover, the metal or the metal compound may be selectively attached only to a particular region by a droplet discharging method, a printing method, a sol-gel method, or the like instead of attaching the metal or the metal compound to the whole surface of the substrate in advance. The metal or the metal compound is not necessarily a completely continuous film shape, and may be dispersed to some extent.

Figure 18A:
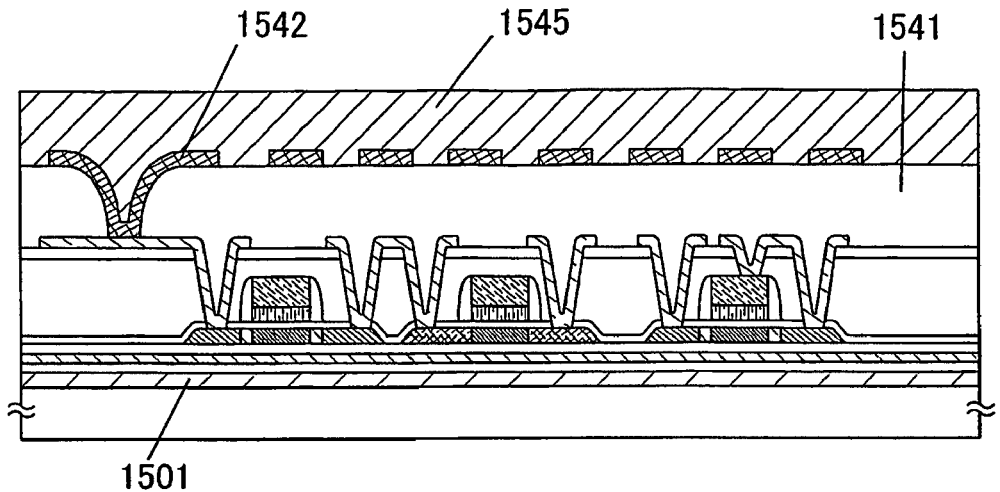
FIGS. 18A to 18C show a manufacturing process of a semiconductor device.

Then, as shown in FIG. 18A, after forming the antenna 1542, a protective layer 1545 is formed over the third interlayer insulating film 1541 so as to cover the antenna 1542. The protective layer 1545 is formed with a material which can protect the antenna 1542 when the peeling layer 1501 is etched away later. For example, the protective layer 1545 can be formed by applying a resin of a silicon type, an acrylate type, or an epoxy type which can be dissolved in water or alcohols.

Figure 18B:
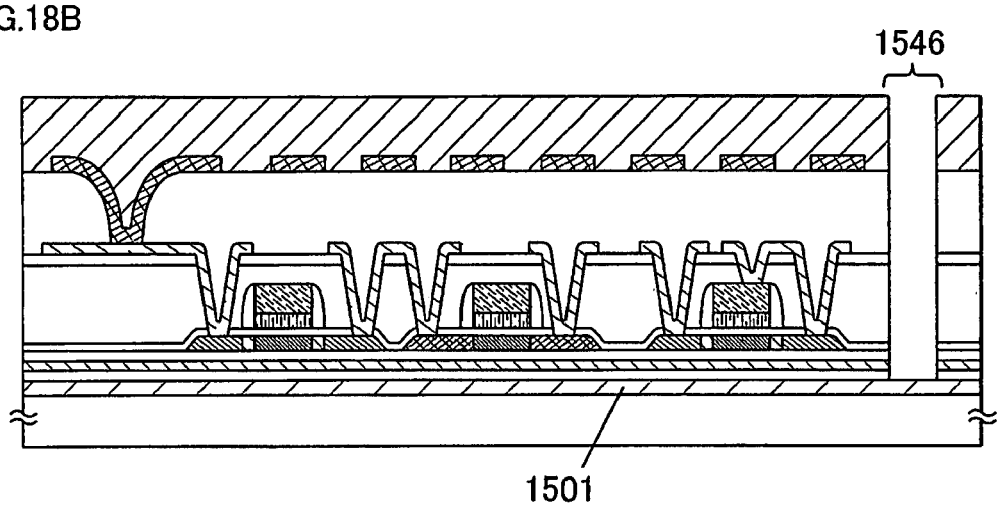

Subsequently, as shown in FIG. 18B, a groove 1546 is formed so as to separate the respective wireless IC tags. The groove 1546 may have the depth such that the peeling layer 1501 is exposed. The groove 1546 can be formed by dicing, scribing, or the like. If it is not necessary to separate the wireless IC tags formed over the first substrate 1500, the groove 1546 is not necessarily formed.

Figure 18C:
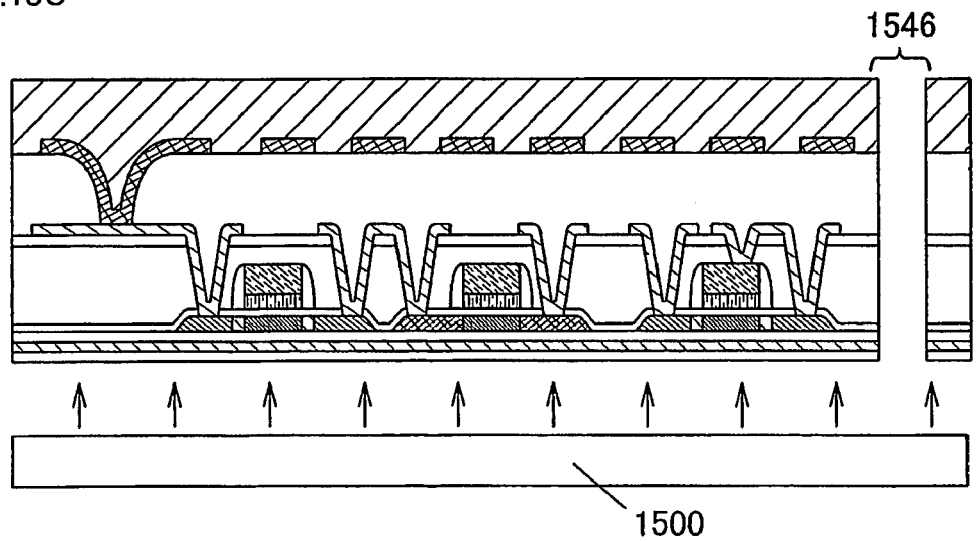

Next, as shown in FIG. 18C, the peeling layer 1501 is etched away. Here, halogen fluoride is used as the etching gas, and this gas is introduced from the groove 1546. For example, $ClF_3$ (chlorine trifluoride) is used, and the etching is conducted at 350° C. with a flow rate of 300 sccm under a pressure of 798 Pa for 3 hours. Nitrogen may be mixed into the $ClF_3$ gas. By using halogen fluoride gas such as $ClF_3$, the peeling layer 1501 can be selectively etched, thereby peeling the first substrate 1500 from the N-channel TFTs 1530 and 1532 and the P-channel TFT 1531. The halogen fluoride may be either gas or liquid.

Figure 19A:
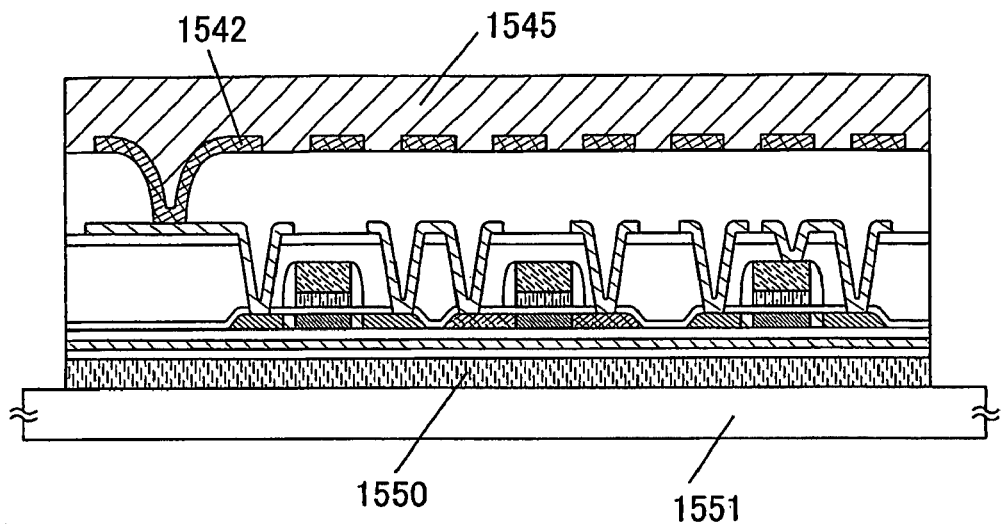
FIGS. 19A and 19B show a manufacturing process of a semiconductor device.

Subsequently, as shown in FIG. 19A, the peeled N-channel TFTs 1530 and 1532 and P-channel TFT 1531 and antenna 1542 are pasted to a second substrate 1551 by using an adhesive 1550. The adhesive 1550 is formed with a material that can paste the second substrate 1551 with the base insulating film 1502. As the adhesive 1550, for example, a reactive curable adhesive, a thermosetting adhesive, a photo curable adhesive such as a UV curable adhesive, an anaerobic adhesive, or the like can be used.

The second substrate 1551 can be formed with a flexible organic material such as paper or plastic.

Figure 19B:
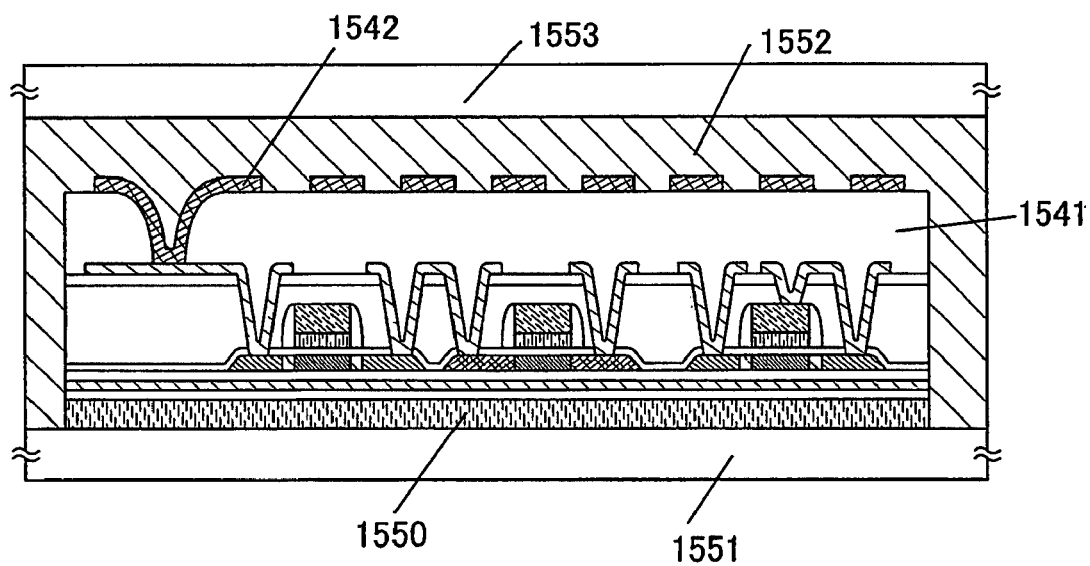

Next, as shown in FIG. 19B, after removing the protective layer 1545, an adhesive 1552 is applied onto the third interlayer insulating film 1541 so as to cover the antenna 1542, and a cover material 1553 is pasted. The cover material 1553 can be formed with a flexible organic material such as paper or plastic, similarly to the second substrate 1551. The thickness of the adhesive 1552 may range from, for example, 10 to 200 μm.

The adhesive 1552 is formed with a material that can paste the cover material 1553 with the third interlayer insulating film 1541 and the antenna 1542. As the adhesive 1552, for example, a reactive curable adhesive, a thermosetting adhesive, a photo curable adhesive such as a UV curable adhesive, an anaerobic adhesive, or the like can be used.

By the above steps, the wireless IC tag is completed. In accordance with the above manufacturing method, an extremely thin integrated circuit with a thickness of 0.3 to 3 μm, typically about 2 μm, can be formed between the second substrate 1551 and the cover material 1553.

The thickness of the integrated circuit includes not only the thickness of the semiconductor element itself but also the thicknesses of the various insulating films and interlayer insulating films formed between the adhesive 1550 and the adhesive 1552. Moreover, the area of the integrated circuit in the wireless IC tag can be made 5 mm or less on each side (25 $mm^2$ or less), more desirably about 0.3 mm on each side (0.09 $mm^2$) to 4 mm on each side (16 $mm^2$).

Although this embodiment has shown the method for separating the substrate and the integrated circuit by etching away the peeling layer provided between the integrated circuit and the first substrate 1500 having high heat resistance, the method of manufacturing a wireless IC tag of the present invention is not limited to this. For example, a metal oxide film may be provided between the integrated circuit and the substrate having high heat resistance and this metal oxide film may be weakened by crystallization, so that the integrated circuit is peeled. Alternatively, a peeling layer using an amorphous semiconductor film containing hydrogen is provided between the integrated circuit and the substrate having high heat resistance and this peeling layer is removed after the peeling layer is modified by irradiation with a laser beam, so that the substrate and the integrated circuit are separated from each other. Moreover, the integrated circuit may be separated from the substrate by mechanically removing or etching away with the use of solution or gas the substrate having high heat resistance with the integrated circuit formed.

Although this embodiment has shown the example of forming the antenna and the integrated circuit over one substrate, the present invention is not limited to this structure. The antenna and the integrated circuit may be formed over different substrates and may be electrically connected by being pasted to each other later.

In general, RFID often uses an electric wave frequency of 13.56 MHz or 2.45 GHz. Considering the enhancement of versatility, it is very important to form wireless IC tags so as to detect electric waves with these frequencies.

The wireless IC tag of this embodiment has advantages that an electric wave is difficult to be blocked as compared with an RFID tag formed using a semiconductor substrate and attenuation of signals due to the block of the electric wave can be prevented. Therefore, since semiconductor substrates are not necessary, the manufacturing cost of the wireless IC tag can be drastically decreased.

Although this embodiment has shown the example of peeling the integrated circuit and pasting the integrated circuit to the flexible substrate, the present invention is not limited to this structure. For example, in the case of using a substrate having high temperature which can withstand the heat treatment in the manufacturing steps of the integrated circuit, such as a glass substrate, it is not always necessary to peel the integrated circuit.

This embodiment mode can be freely combined with other embodiment modes and embodiments.

Embodiment 6

Specific usage of the wireless IC tag manufactured in accordance with the manufacturing method shown in another embodiment will be described hereinafter.

By applying the present invention, a laser irradiation process can be favorably conducted to the whole surface of the semiconductor film. Therefore, the degree of freedom of the layout and size of the semiconductor element and the degree of integration can be increased. Further, the product quality of the wireless IC tag using the TFT manufactured by the present invention is favorable and has no variation.

Figure 20A:
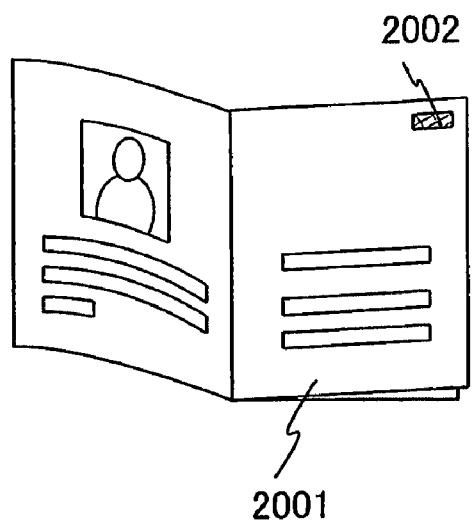
FIGS. 20A and 20B show specific usage of a semiconductor device.

FIG. 20A shows a passport 2001 with a wireless IC tag 2002 pasted thereto. Alternatively, the wireless IC tag 2002 may be embedded in the passport 2001. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information showing this is the real one is inputted in the wireless IC tag and an access authority is set so that the information cannot be read and written illegally. By using the tag in this way, it is possible to distinguish the forged one and the real one.

Figure 20B:
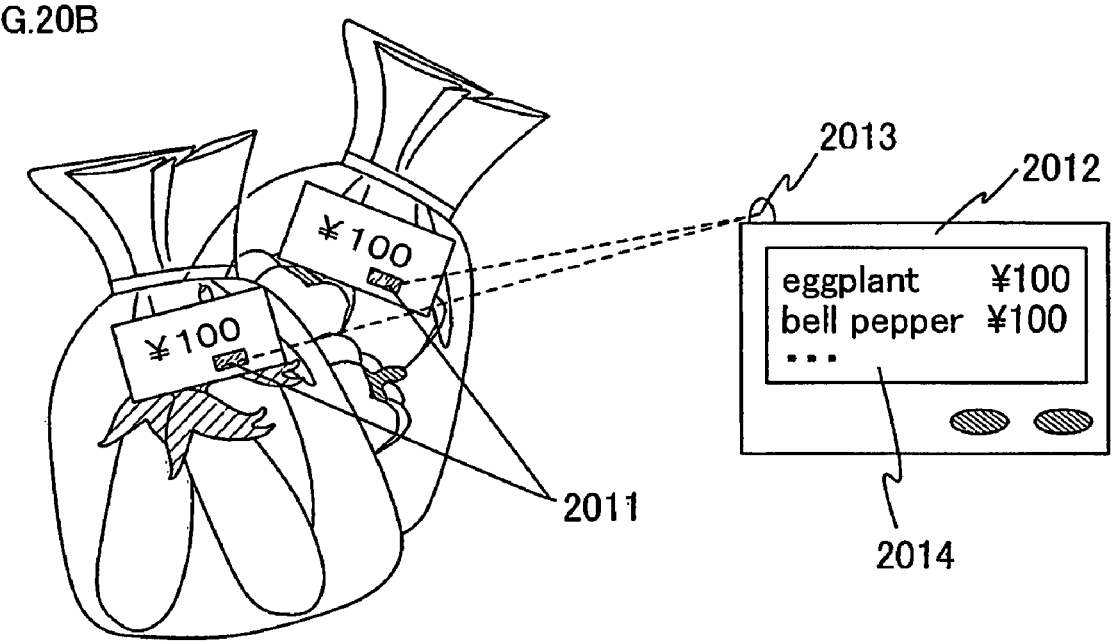

Besides, the wireless IC tag can be used as a memory. FIG. 20B shows an example of embedding a wireless IC tag 2011 in a label to be pasted to a package of vegetables. Alternatively, the wireless IC tag may be attached directly to the package or embedded in the package. In the wireless IC tag 2011, a production area, a producer, a manufacturing date, and a process at a production stage such as a process method, a circulation process of the product, a price, quantity, an intended purpose, a shape, weight, an expiration date, each kind of authentication information, and the like can be recorded. Information from the wireless IC tag 2011 is received with an antenna portion 2013 of a wireless reader 2012 and read out thereby, and displayed in a display portion 2314 of the reader 2012. Thus, wholesalers, retailers, and consumers can know the information easily. Moreover, access authority can be set for each of producers, traders, and consumers. Thus, those who do not have the access authority cannot read, write; rewrite, and erase the data in the wireless IC tag.

The wireless IC tag can be used in the following way. At the payment, the information that the payment has been made is written in the wireless IC tag, and the wireless IC tag is checked by a checking means provided at an exit whether or not the information that the payment has been made is written in the wireless IC tag. If the IC tag is brought out from the store without making the payment, the alarm rings. With this method, forgetting of the payment and shoplifting can be prevented.

In consideration of protecting customer's privacy, the following method is also possible. At the payment at a cash register, any of the followings is conducted; (1) data inputted in the wireless IC tag are locked by pin numbers or the like, (2) data itself inputted in the wireless IC tag are encrypted, (3) data inputted in the wireless IC tag are erased, and (4) data inputted in the wireless IC tag are destroyed. Then, a checking means is provided at an exit, and whether any one of (1) to (4) has been conducted or whether the data in the wireless IC tag are not processed is checked, so that whether the payment has been made or not is checked. In this way, whether the payment has been made or not can be checked in the store, and reading out the information in the wireless IC tag against the owner's will outside the store can be prevented.

Several methods are given to destroy the data inputted in the wireless IC tag in (4). For example, (a) data are replaced by meaningless data by writing one or both of "0 (off)" and "1 (on)" in at least a part of electronic data in the wireless IC tag, or (b) current is fed excessively in the wireless IC tag to physically destroy a part of wiring in a semiconductor element in the wireless IC tag.

The wireless IC tag can be used in another way: the information on a product to which the wireless IC tag is attached is read by a reader of a home-use electric appliance such as a refrigerator and a washing machine, whereby quality management method or handling method of a product can be automatically adjusted. Moreover, by attaching a monitor onto a home-use electric appliance, the information on products can be displayed on the monitor.

For example, a product (for example, food) has appropriate temperature and humid states for preservation. Moreover, temperature setting in the refrigerator per season is significant in terms of energy saving. However, it is troublesome for consumers to do this on their own. However, if consumers do not adjust the temperature, there is a possibility that the product becomes worse easily or the power consumption gets more than necessary depending on the season.

Figure 21A:
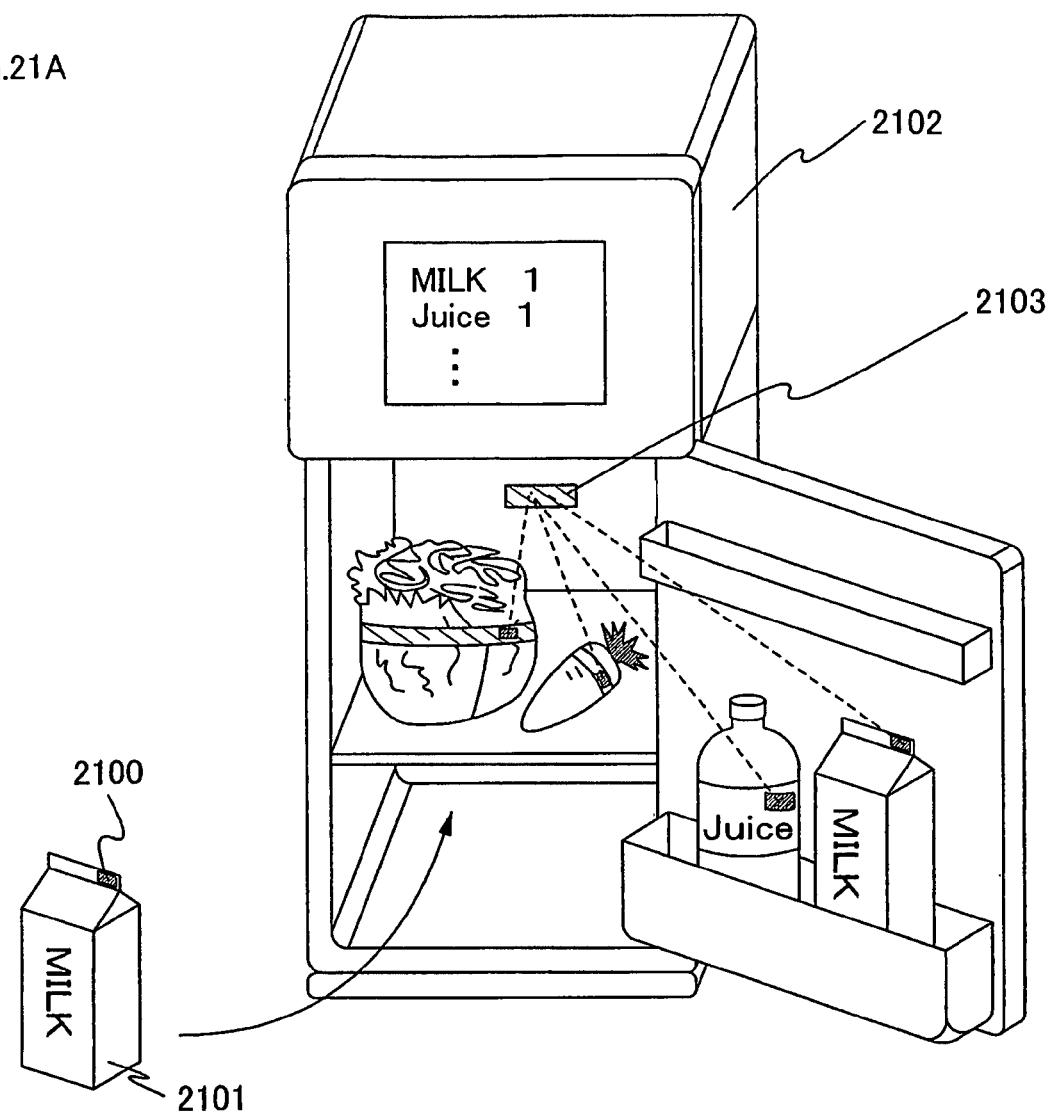
FIGS. 21A and 21B show specific usage of a semiconductor device.
Figure 21B:
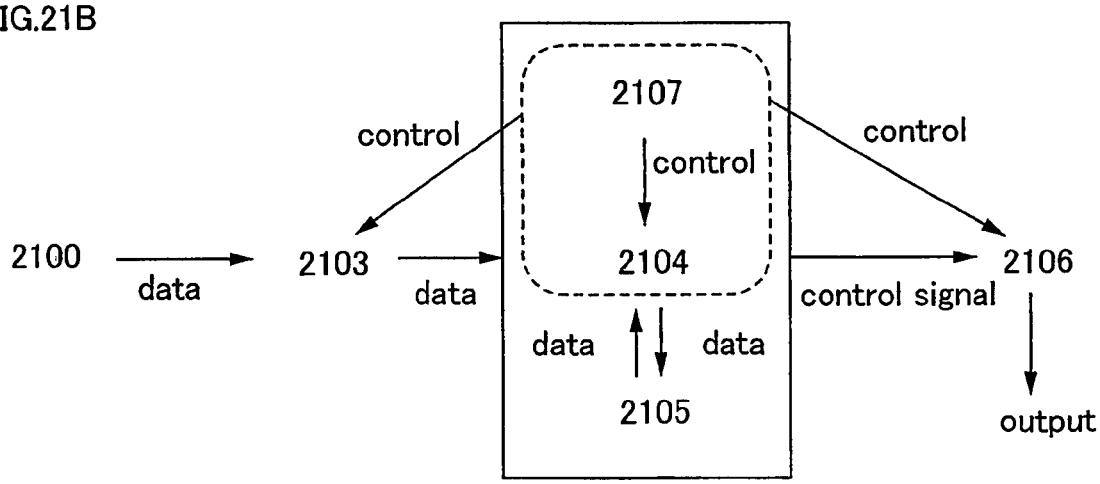
Figure 22:
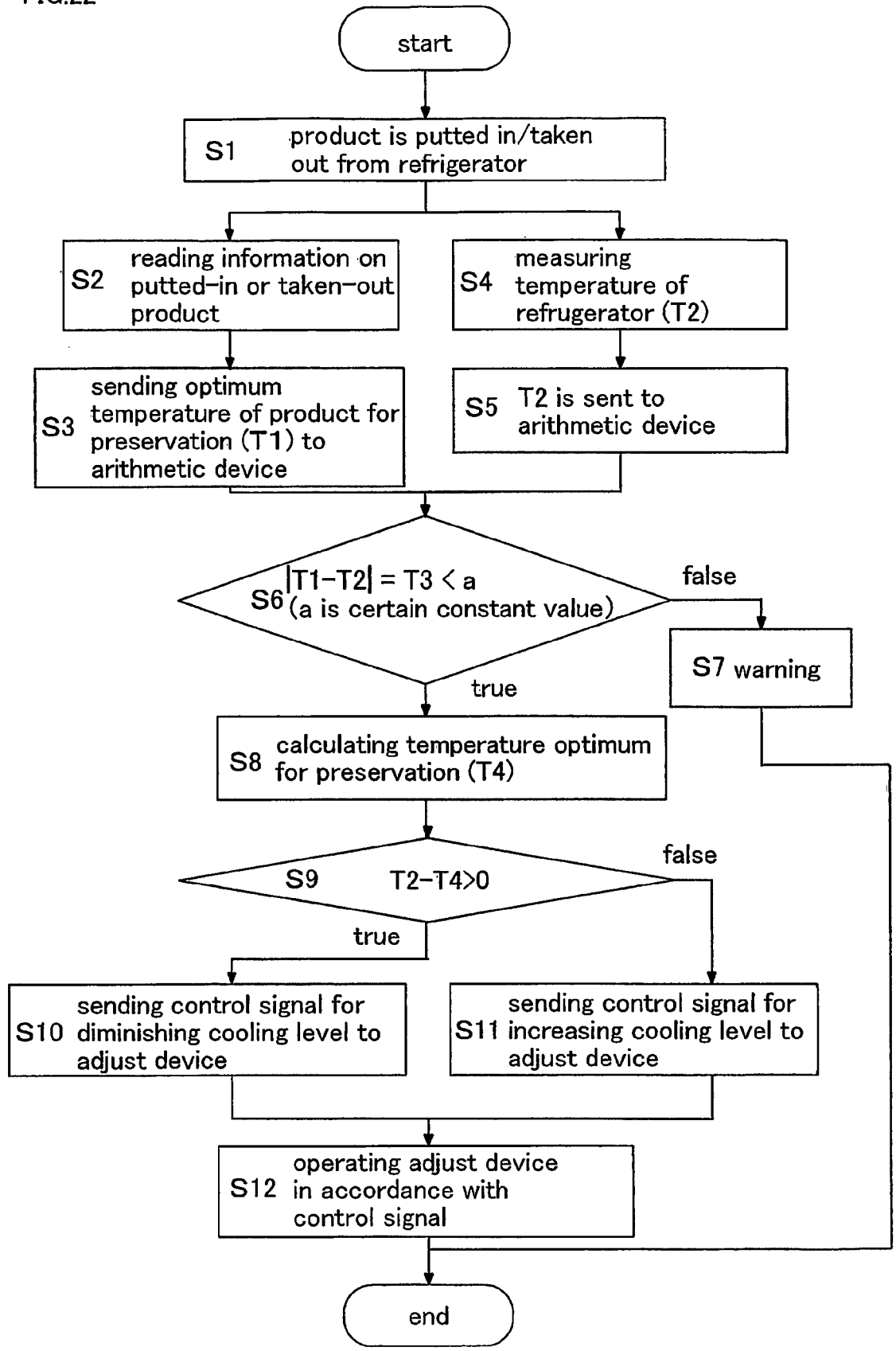
FIG. 22 is a flow chart showing an information processing method of a semiconductor device.

FIG. 21A shows a case where a refrigerator 2102 is opened to put-in or take-out a product 2101 with a wireless IC tag 2100 attached thereto in the refrigerator 2102. A flowchart of the data read here is shown in FIG. 21B. Moreover, a flowchart of a process carried out by the refrigerator in accordance with taking out and putting in of the product 2101 is shown in FIG. 22.

First, as shown in FIG. 21A, the product 2101 with a wireless IC tag attached thereto is putted in/taken out from the refrigerator 2102 (Step S1). At this time, the information on the putted-in or taken-out product is read (Step S2). Next, the data on the product are sent to an arithmetic device 2104 in the refrigerator 2102 (Step S3) and stored in a memory device 2105 as necessary. The data contain the information on the kind of the product, the optimum temperature ($T_1$) and humidity of the product for preservation, an expiration date, and the like. At the same time, the temperature ($T_2$) and the humidity of the refrigerator 2102 are measured (Step S4) and sent to the arithmetic device 2104 (Step S5). The data are stored in the memory device 2105 as necessary. Although the temperature is taken up in the following description, the other factors can also be processed similarly.

Next, the arithmetic device 2104 takes out the data on the optimum temperature ($T_1$) for preservation of the putted-in or taken-out product and the temperature ($T_2$) in the refrigerator from the memory device 2105 to calculate an absolute value ($T_3$) of the difference between $T_1$ and $T_2$, whereby comparison is made on whether a certain value (a) and $T_3$ satisfy the following formula (4) (Step S6).

$$|T_1-T_2|=T_3<a \qquad \text{formula (4)}$$

If $T_3$ is at or over the certain value (a), i.e., if the formula (4) is false, it is not appropriate to preserve the product in the refrigerator 2102; therefore, warning is given to consumers by means of sound, light, or the like (Step S7) and the temperature in the refrigerator 2102 is not changed. If $T_3$ is lower than the certain value (a), i.e., if the formula (4) is true, the following process is carried out.

The arithmetic device 2104 calculates the temperature ($T_4$) optimum for preservation of the putted-in or taken-out product (Step S8). This temperature ($T_4$) is compared with the temperature ($T_2$) in the refrigerator (Step S9) and then a cooling level is determined in accordance with the result of the comparison. If $T_2>T_4$, a control signal is sent to an adjust device 2106 (Step S10) so as to increase the temperature, and if $T_2<T_4$, a control signal is sent to the adjust device 2106 (Step 11) so as to decrease the temperature (Step S11). The adjust device 2106 operates in accordance with the control signal (Step S12) and adjusts the temperature in the refrigerator 2102 so as to be $T_4$.

In the refrigerator 2102, the input and output of the reader 2103, the arithmetic device 2104, and the adjust device 2106 are controlled by the control device 2107. A CPU may be used as the arithmetic device 2104 and the control device 2107.

As another function, by knowing the number and kind of products in the refrigerator 2102, it is possible to increase the temperature when the refrigerator 2102 does not contain many products and decrease the temperature when the refrigerator 2102 contains many products. Moreover, it is possible to increase or decrease the temperature at only a particular location within the refrigerator 2102. Furthermore, by setting a monitor 2108 in the refrigerator 2102, it is possible to confirm what are contained inside without opening the refrigerator 2102.

Moreover, it is possible to execute a cooling method in accordance with the product putted in the refrigerator. Based on the information in the wireless IC tag, whether the temperature is decreased gradually or rapidly is judged. In accordance with the judge, a control signal is sent to the adjust device 2106, whereby the adjust device adjusts the cooling level based on the control signal.

In this way, the product can be preserved favorably for a long time by controlling the condition inside the refrigerator in accordance with the situation, and moreover, the excessive power consumption can be decreased. The method of adjusting the temperature is not limited to the aforementioned one.

Although this embodiment has shown the refrigerator for preserving foods, similar usage is possible with items which need to be preserved while adjusting the temperature, humidity, brightness, and the like by attaching a wireless IC tag, in which the information on the item has been inputted, to a container or attaching the wireless IC tag to a sample itself (the items are, for example, (1) chemical substances or medical products; (2) biological bodies such as cells, bacteria, plants, and animals; and (3) biological-body-derived substances such as enzyme and DNA).

In the case of a washing machine, it is necessary to set a washing method suitable for washing, the kind and amount of detergent, the amount of water to be used for the washing, and the like. In general, the laundry varies in size and kind; therefore, it is troublesome to specify the setting in accordance with each piece of laundry. In recent years, a number of washing machines having many functions are on available in the market; however, in many cases, consumers do not make full use of such functions.

In a single-tub washing machine generally available in the market, after putting the laundry into a tub serving as a washer and a dewaterer, the motive energy for rotating the tub serving as a washer and a dewaterer is measured, so that the weight of the laundry is measured to determine the amount of water to be used. Therefore, if the laundry has the same weight, the amount of water and the washing method are the same when the laundry is as large as a bed sheet and when the laundry is as small as a denim jacket. Since the amount of detergent is determined based on the amount of water used for the washing, the amount of detergent is not always appropriate in the above case.

Figure 23:
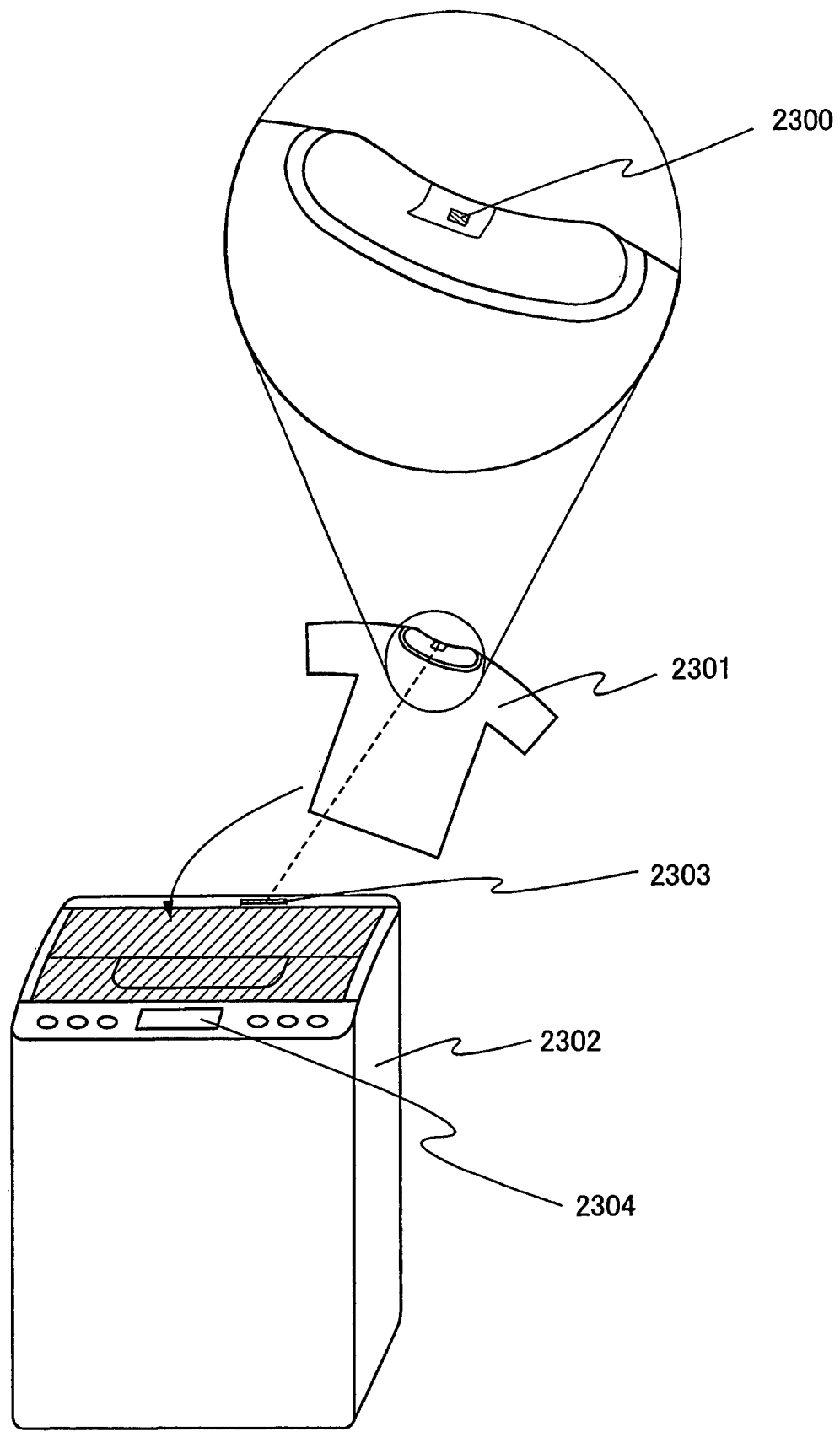
FIG. 23 shows specific usage of a semiconductor device.

Consequently, as shown in FIG. 23, when a clothing 2301 to which a wireless IC tag 2300 is embedded is putted into a washing machine 2302, the information on the clothing 2301 such as the kind, size, weight, and material is read by a reader 2303 provided to the washing machine 2302, and such information is sent to an arithmetic device. Based on the information, the arithmetic device judges a washing program, the kind and amount of detergent, and the amount of water, which are appropriate for the clothing 2301. Then, the kind and amount of detergent to be poured is displayed on a monitor 2304 provided to the washing machine. A consumer may pour detergent in accordance with the display and press a start button of the washing machine. In this way, washing starts after automatically specifying the setting on the washing.

Embodiment 7

Various electronic appliances can be completed by using a TFT manufactured by the present invention. Specific examples are described with reference to FIGS. 24A to 24F.

According to the present invention, a laser beam with homogeneous intensity can be obtained without causing laser interference stripes of the laser to appear on a semiconductor film. By using the laser beam, the whole surface of the semiconductor film can be annealed favorably. Thus, it becomes possible to remove the restriction in layout and size of semiconductor devices and to increase the degree of integration. Since the degree of crystallization is the same in any part of the substrate, the product quality of manufactured semiconductor elements is favorable and the variation in the product quality can be eliminated. As a result, electronic appliances as final products can be manufactured with high throughput and high product quality. The specific example is described with reference to the drawings.

Figure 24A:
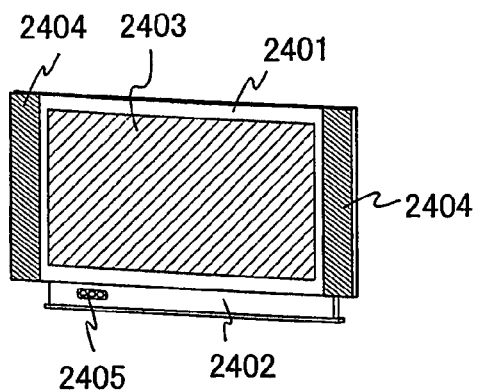
FIGS. 24A to 24F show examples of electronic appliances.

FIG. 24A shows a display device including a housing 2401, a supporter 2402, a display portion 2403, a speaker portion 2404, a video input terminal 2405, and the like. This display device is manufactured by using the TFT formed by the manufacturing method shown in another embodiment to a driver IC, the display portion 2403, and the like. The display device includes a liquid crystal display device, a light-emitting display device, and the like, and moreover includes all the information displaying devices for computers, television reception, advertisement display, and so on. Specifically, a display, a head mount display, a reflection type projector, and the like are given.

Figure 24B:
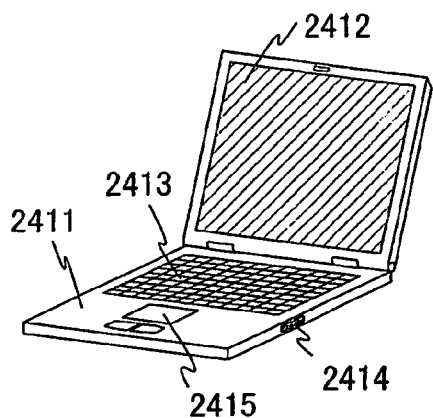

FIG. 24B shows a computer including a housing 2411, a display portion 2412, a keyboard 2413, an external connection port 2414, a pointing mouse 2415, and the like. A TFT formed in accordance with the present invention can be applied to not only a pixel portion in the display portion 2412 but also a semiconductor device such as a driver IC for display, a CPU inside a main body, or a memory.

Figure 24C:
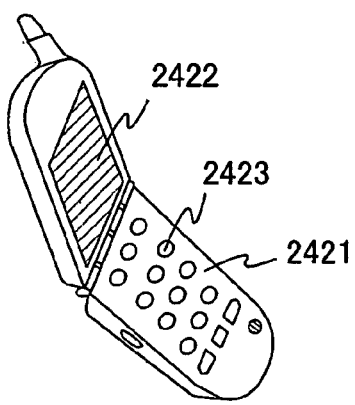

FIG. 24C shows a cellular phone, as a typical example of mobile information processing terminals. This cellular phone includes a housing 2421, a display portion 2422, an operation key 2423, and the like. A TFT formed in accordance with the present invention can be applied to not only a pixel portion in the display portion 2422 and a sensor portion 2424 but also a driver IC for display, a memory, an audio processing circuit, and the like. The sensor portion 2424 has an optical sensor element, whereby the brightness of the display portion 2422 is controlled in accordance with the lighting intensity of the sensor portion 2424 or the brightness of the operation key 2423 is controlled in accordance with the lighting intensity of the sensor portion 2424. Thus, the power consumption of the cellular phone can be suppressed.

In addition to the above cellular phone, a semiconductor device formed in accordance with the present invention can be used for an electronic appliance such as a PDA (Personal Digital Assistant, information mobile terminal), a digital camera, or a compact game machine. For example, it is possible to apply the semiconductor device of the present invention to a functional circuit such as a CPU, a memory, or a sensor or to a pixel portion of such an electronic appliance or a driver IC for display.

Figure 24D:
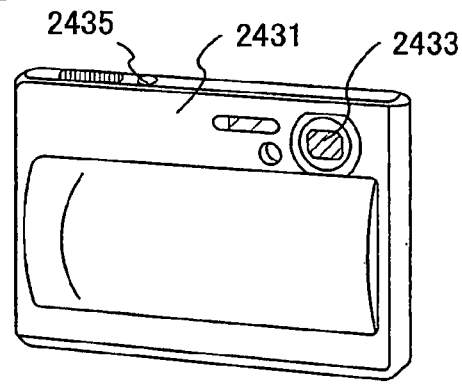
Figure 24E:
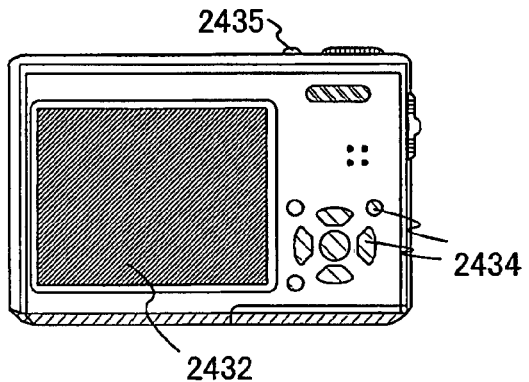

FIGS. 24D and 24E show a digital cameral. FIG. 24E shows a rear side of the digital camera shown in FIG. 24D. This digital camera includes a housing 2431, a display portion 2432, a lens 2433, an operation key 2434, a shutter 2435, and the like. A TFT formed in accordance with the present invention can be applied to a pixel portion in the display portion 2432, a driver IC for driving the display portion 2432, a memory, or the like.

Figure 24F:
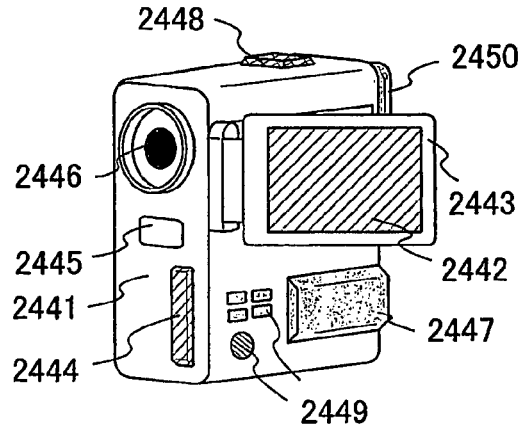
Figure 25:
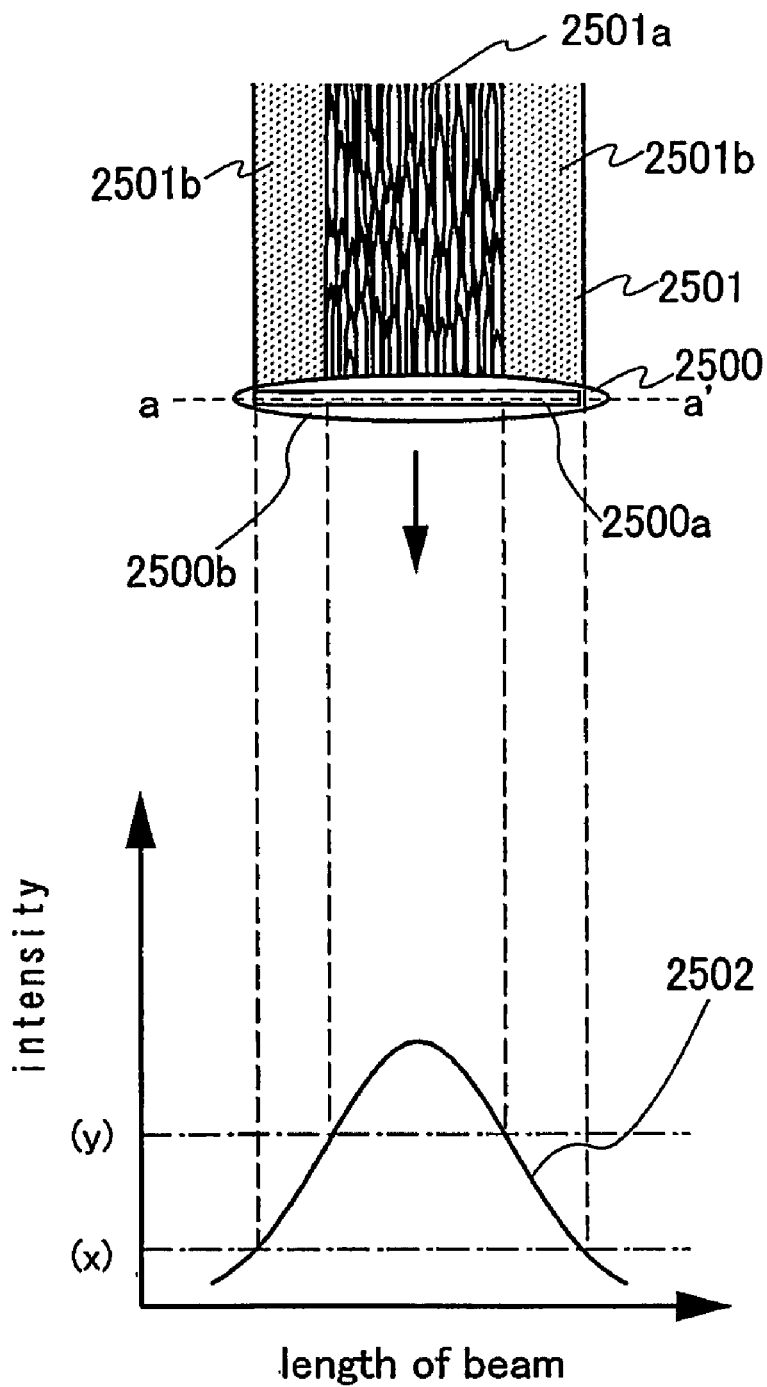
FIG. 25 shows a relation between intensity distribution of a laser beam and an irradiation track on a semiconductor film (Related Art)
Figure 26:
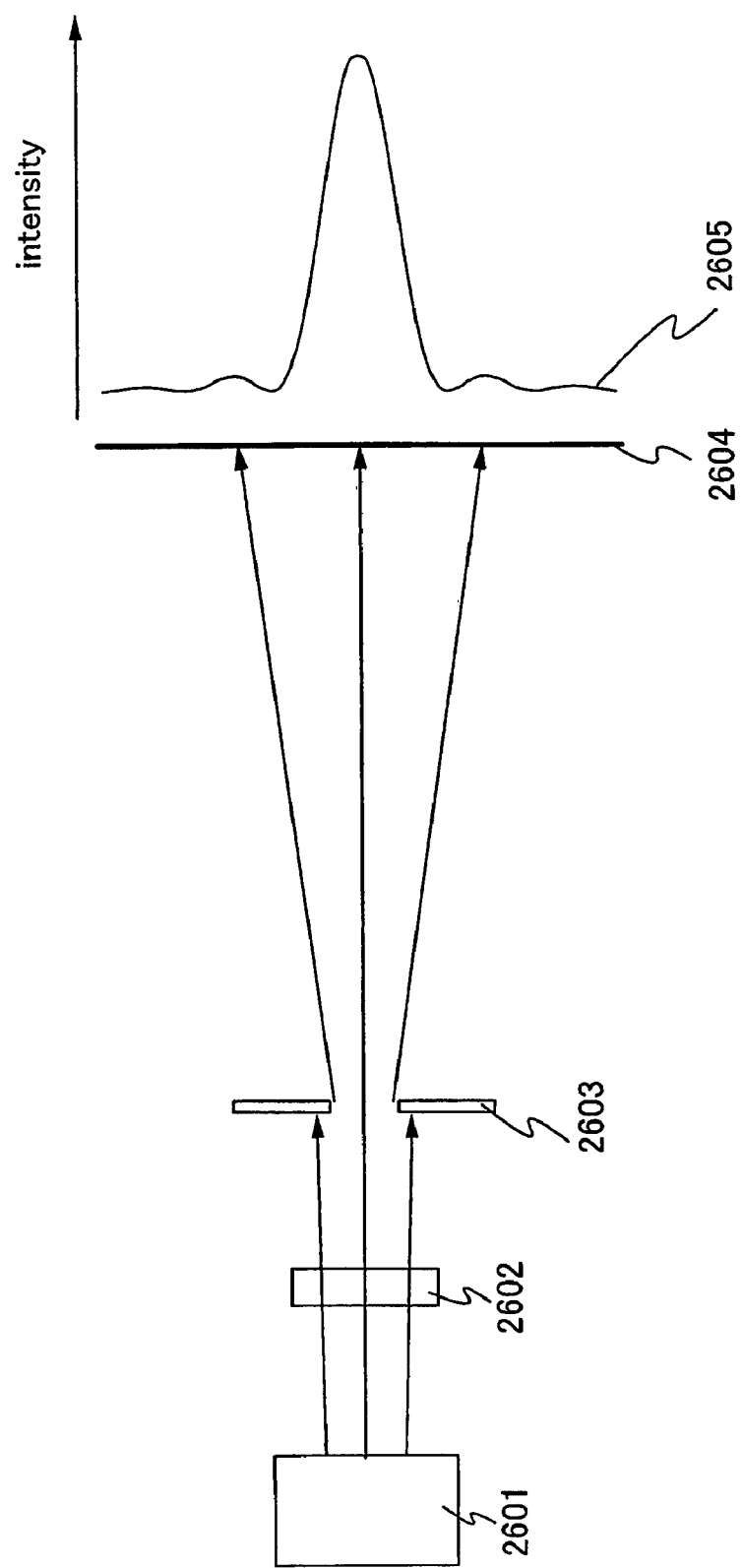
FIG. 26 describes a laser irradiation apparatus using a diffractive optical element (Related Art).

FIG. 24F shows a digital video camera including a main body 2341, a display portion 2342, a housing 2343, an external connection port 2344, a remote control receiving portion 2345, an image receiving portion 2346, a battery 2347, an audio input portion 2348, an operation key 2349, an eyepiece portion 2450, and the like. A TFT formed in accordance with the present invention can be applied to a pixel portion in the display portion 2342, a driver IC for controlling the display portion 2342, a memory, a digital input processing device, or the like.

Besides, the present invention can be applied to a navigation system, a sound reproducing device, an image reproducing device equipped with a recording medium, and the like. TFTs formed in accordance with the present invention can be applied to pixel portions of display portions of these devices, driver ICs for controlling the display portions, digital input processing devices, sensor portions, and the like.

As thus described, the application range of a semiconductor device manufactured in accordance with the present invention is quite wide, and the semiconductor device of the present invention can be applied to electronic appliances of every field. It is to be noted that the display devices used in the electronic appliances can employ not only glass substrates but also heat-resistant substrates formed with a synthetic resin, in accordance with the size, strength, and intended purpose. Accordingly, further reduction in weight can be achieved.

This application is based on Japanese Patent Application serial no. 2005-133788 filed in Japan Patent Office on May 2, in 2005, the entire contents of which are hereby incorporated by reference.

EXPLANATION OF REFERENCE

101: LASER OSCILLATOR, 102: DIFFRACTIVE OPTICAL ELEMENT, 103: SLIT, 104: PROJECTING LENS, 105: CONDENSING LENS, 106: MIRROR, 107: SEMICONDUCTOR FILM, 108: SUCTION STAGE, 109: X STAGE, 110: Y STAGE, 301: OPENING PORTION, 302: BLOCKING PLATE, 330: CENTRAL WAVELENGTH, 501: LASER OSCILLATOR, 502: DIFFRACTIVE OPTICAL ELEMENT, 503: SLIT, 504: PROJECTING LENS, 505: CONDENSING LENS, 506: SEMICONDUCTOR FILM, 507: CORRECTING LENS, 515: CENTRAL WAVELENGTH, 601: LASER OSCILLATOR, 602: DIFFRACTIVE OPTICAL ELEMENT, 603: SLIT, 604: PROJECTING LENS, 605: CONDENSING LENS, 606: MIRROR, 607: SEMICONDUCTOR FILM, 608: SUCTION STAGE, 609: X STAGE, 610: Y STAGE, 701: LASER BEAM, 702: OBJECT, 703: WAVE, 704: MIRROR, 705: REFLECTED WAVE, 706: WAVE, 710: PHASE CONJUGATE MIRROR 711: REFLECTED WAVE, 712: WAVE, 901: LASER OSCILLATOR, 902: DIFFRACTIVE OPTICAL ELEMENT, 903: SLIT, 904: BEAM SPLITTER, 905: SEMICONDUCTOR FILM, 906: PHASE CONJUGATE MIRROR, 907: CONDENSING LENS, 1000: LASER OSCILLATOR, 1003: PHASE CONJUGATE MIRROR 1004: BEAM SPLITTER, 1005: DIFFRACTIVE OPTICAL ELEMENT, 1006: SLIT, 1007: PROJECTING LENS, 1008: CONDENSING LENS, 1009: SEMICONDUCTOR FILM, 1010: X STAGE, 1011: Y STAGE, 1200: SUBSTRATE, 1201: BASE FILM, 1202: AMORPHOUS SEMICONDUCTOR FILM, 1203: LASER, 1205: CRYSTALLINE SEMICONDUCTOR FILM, 1206: SEMICONDUCTOR FILM, 1207: GATE INSULATING FILM, 1208: GATE ELECTRODE, 1209: SOURCE REGION, 1210: DRAIN REGION, 1211: LDD REGION, 1212: N-CHANNEL TFT, 1213: N-CHANNEL TFT, 1214: P-CHANNEL TFT, 1215: INSULATING FILM, 1216: INSULATING FILM, 1217: WIRE, 1218: INSULATING FILM, 1300: SUBSTRATE, 1301: BASE FILM, 1302: SEMICONDUCTOR FILM, 1303: SEMICONDUCTOR FILM, 1304: LASER BEAM, 1305: SEMICONDUCTOR FILM, 1306: OXIDE FILM, 1307: SEMICONDUCTOR FILM, 1308: SEMICONDUCTOR FILM, 1499: LASER BEAM, 1500: FIRST SUBSTRATE, 1501: PEELING LAYER, 1502: BASE INSULATING FILM, 1503: SEMICONDUCTOR FILM, 1504: SEMICONDUCTOR FILM, 1505: SEMICONDUCTOR FILM, 1506: SEMICONDUCTOR FILM, 1508: GATE INSULATING FILM, 1509: GATE ELECTRODE, 1510: GATE ELECTRODE, 1511: GATE ELECTRODE, 1512: RESIST, 1513: RESIST, 1516: LOW-CONCENTRATION IMPURITY REGION, 1518: RESIST, 1520: HIGH-CONCENTRATION IMPURITY REGION, 1521: INSULATING FILM, 1522: SIDEWALL, 1526: RESIST, 1527: HIGH-CONCENTRATION IMPURITY REGION, 1528: HIGH-CONCENTRATION IMPURITY REGION, 1530: N-CHANNEL TFT, 1531: P-CHANNEL TFT, 1532: N—CHANNEL TFT, 1533: FIRST INTERLAYER INSULATING FILM, 1534: SECOND

INTERLAYER INSULATING FILM, 1535: WIRE, 1536: WIRE, 1538: WIRE, 1539: WIRE, 1541: THIRD INTERLAYER INSULATING FILM, 1542: ANTENNA, 1545: PROTECTIVE LAYER, 1546: GROOVE, 1550: ADHESIVE, 1551: SECOND SUBSTRATE, 1552: ADHESIVE, 1553: COVER MATERIAL, 1850: EYEPIECE PORTION, 2001: PASSPORT, 2002: WIRELESS IC TAG; 2004: MONITOR, 2011: WIRELESS IC TAG, 2012: READER, 2013: ANTENNA PORTION, 2014: DISPLAY PORTION, 2100: WIRELESS IC TAG; 2101: PRODUCT, 2102: REFRIGERATOR, 2103: READER, 2104: ARITHMETIC DEVICE, 2105: MEMORY DEVICE, 2106: ADJUST DEVICE, 2107: CONTROL DEVICE, 2108: MONITOR, 2300: WIRELESS IC TAG; 2301: LAUNDRY 2302: WASHING MACHINE, 2303: READER, 2341: MAIN BODY, 2342: DISPLAY PORTION, 2343: HOUSING, 2344: EXTERNAL CONNECTION PORT, 2345: REMOTE CONTROL RECEIVING PORTION, 2346: IMAGE RECEIVING PORTION, 2347: BATTERY, 2348: AUDIO INPUT PORTION, 2349: OPERATION KEY, 2401: HOUSING 2402: SUPPORTER, 2403: DISPLAY PORTION, 2404: SPEAKER PORTION, 2405: VIDEO INPUT TERMINAL, 2411: HOUSING; 2412: DISPLAY PORTION, 2413: KEYBOARD, 2414: EXTERNAL CONNECTION PORT, 2415: POINTING MOUSE, 2421: HOUSING, 2422: DISPLAY PORTION, 2423: OPERATION KEY, 2424: SENSOR PORTION, 2431: HOUSING, 2432: DISPLAY PORTION, 2433: LENS, 2435: SHUTTER, 2500: BEAM SPOT, 2501: IRRADIATION TRACK, 2502: INTENSITY DISTRIBUTION, 2601: LASER OSCILLATOR, 2602: DIFFRACTIVE OPTICAL ELEMENT, 2603: SLIT, 2604: IRRADIATION SURFACE

The invention claimed is:

1. A laser irradiation apparatus comprising:
a laser oscillator;
a beam homogenizer for homogenizing intensity distribution of a laser beam emitted from the laser oscillator;
a slit for blocking an end portion of the laser beam in a major-axis direction;
a projecting lens for projecting an image at the slit onto an irradiation surface; and
a condensing lens for condensing the image at the slit on the irradiation surface,
wherein the projecting lens acts in the major-axis direction of the laser beam,
wherein the condensing lens comprises a spherical lens and a concave cylindrical lens,
wherein the condensing lens acts in a minor-axis direction of the laser beam,
wherein the concave cylindrical lens acts in the major-axis direction of the laser beam, and
wherein the slit is provided between the beam homogenizer and the projecting lens.

2. The laser irradiation apparatus according to claim 1, wherein the beam homogenizer is a diffractive optical element.

3. The laser irradiation apparatus according to claim 1, wherein the projecting lens is a convex cylindrical lens or a convex spherical lens.

4. The laser irradiation apparatus according to claim 1, wherein the spherical lens is a convex spherical lens.

5. The laser irradiation apparatus according to claim 1, wherein $1/f=(1/d_1)+(1/d_2)$ and $d_1:d_2=a:b$ are satisfied (a is a width of an opening portion of the slit, b is a length of a major axis of the laser beam on the irradiation surface, f is a focal length of the projecting lens, $d_1$ is a distance from a surface of the slit on an emission side to a first principal point of the projecting lens, and $d_2$ is a distance from a second principal point of the projecting lens to the irradiation surface).

6. The laser irradiation apparatus according to claim 1, wherein the laser beam emitted from the laser oscillator is selected from the group consisting of a Ti:sapphire laser, an Ar ion laser, and a laser using an optical fiber where said optical fiber is doped with one or more selected from Nd, Yb, Cr, Ti, Ho, Er, Tm, and Ta as a medium.

7. The laser irradiation apparatus according to claim 1, wherein the laser beam emitted from the laser oscillator is a laser using a material selected from the group consisting of a single-crystal YAG, a single-crystal $YVO_4$, a single-crystal forsterite, a single-crystal $YAlO_3$, a single-crystal $GdVO_4$, a polycrystalline YAG, a polycrystalline $Y_2O_3$, a polycrystalline $YVO_4$, a polycrystalline $YAlO_3$, and a polycrystalline $GdVO_4$.

8. The laser irradiation apparatus according to claim 1, wherein the laser beam is a higher harmonic converted by a non-linear optical element.

9. The laser irradiation apparatus according to claim 1, wherein an opening portion of the slit is adjusted by moving a blocking plate.

10. The laser irradiation apparatus according to claim 1, wherein the image at the slit and an image on the irradiation surface are in a conjugated relation by the projecting lens.

11. A laser irradiation apparatus comprising:
a laser oscillator;
a beam homogenizer for homogenizing intensity distribution of a laser beam emitted from the laser oscillator;
a slit for blocking an end portion of the laser beam in a major-axis direction;
a projecting lens for projecting an image at the slit onto an irradiation surface; and
a condensing lens for condensing the image at the slit on the irradiation surface,
wherein the projecting lens comprises a cylindrical lens,
wherein the major-axis direction of the laser beam is perpendicular to a generatrix direction of the cylindrical lens,
wherein the condensing lens comprises a spherical lens and a concave cylindrical lens,
wherein the condensing lens acts in a minor-axis direction of the laser beam,
wherein the concave cylindrical lens acts in the major-axis direction of the laser beam, and
wherein the slit is provided between the beam homogenizer and the projecting lens.

12. The laser irradiation apparatus according to claim 11, wherein the beam homogenizer is a diffractive optical element.

13. The laser irradiation apparatus according to claim 11, wherein the projecting lens is a convex cylindrical lens.

14. The laser irradiation apparatus according to claim 11, wherein the spherical lens is a convex spherical lens.

15. The laser irradiation apparatus according to claim 11, wherein $1/f=(1/d_1)+(1/d_2)$ and $d_1:d_2=a:b$ are satisfied (a is a width of an opening portion of the slit, b is a length of a major axis of the laser beam on the irradiation surface, f is a focal length of the projecting lens, $d_1$ is a distance from a surface of the slit on an emission side to a first principal point of the projecting lens, and $d_2$ is a distance from a second principal point of the projecting lens to the irradiation surface).

16. The laser irradiation apparatus according to claim 11, wherein the laser beam emitted from the laser oscillator is selected from the group consisting of a Ti:sapphire laser, an Ar ion laser, and a laser using an optical fiber where said optical fiber is doped with one or more selected from Nd, Yb, Cr, Ti, Ho, Er, Tm, and Ta as a medium.

17. The laser irradiation apparatus according to claim 11, wherein the laser beam emitted from the laser oscillator is a laser using a material selected from the group consisting of a single-crystal YAG, a single-crystal $YVO_4$, a single-crystal forsterite, a single-crystal $YAlO_3$, a single-crystal $GdVO_4$, a polycrystalline YAG, a polycrystalline $Y_2O_3$, a polycrystalline $YVO_4$, a polycrystalline $YAlO_3$, and a polycrystalline $GdVO_4$.

18. The laser irradiation apparatus according to claim 11, wherein the laser beam is a higher harmonic converted by a non-linear optical element.

19. The laser irradiation apparatus according to claim 11, wherein an opening portion of the slit is adjusted by moving a blocking plate.

20. The laser irradiation apparatus according to claim 11, wherein the image at the slit and an image on the irradiation surface are in a conjugated relation by the projecting lens.

21. The laser irradiation apparatus according to claim 1, further comprising a mirror between the projecting lens and the condensing lens.

22. The laser irradiation apparatus according to claim 11, further comprising a mirror between the projecting lens and the condensing lens.

* * * * *